(12) United States Patent
Meyer et al.

(10) Patent No.: US 10,677,620 B2
(45) Date of Patent: Jun. 9, 2020

(54) SYSTEM AND METHOD FOR SENSOR DIAGNOSTICS DURING FUNCTIONAL OPERATION

(71) Applicant: NXP B.V., Eindhoven (NL)

(72) Inventors: Robert Meyer, Hamburg (DE); Michael Schoeneich, Hamburg (DE)

(73) Assignee: NXP B.V., Eindhoven (NL)

( * ) Notice: Subject to any disclaimer, the term of this patent is extended or adjusted under 35 U.S.C. 154(b) by 50 days.

(21) Appl. No.: 15/967,840

(22) Filed: May 1, 2018

(65) Prior Publication Data

US 2019/0339101 A1 Nov. 7, 2019

(51) Int. Cl.
*G01D 18/00* (2006.01)
*G01D 5/14* (2006.01)
*G01D 5/16* (2006.01)

(52) U.S. Cl.
CPC ............ *G01D 18/00* (2013.01); *G01D 5/142* (2013.01); *G01D 5/16* (2013.01)

(58) Field of Classification Search
CPC .......... G01D 18/00; G01D 5/14; G01D 5/142; G01D 5/16; G01D 5/24466; G01R 33/09; G01R 33/0035; G01R 33/0017; G01R 33/07; G01R 35/005; H03M 3/458; H03M 1/34
See application file for complete search history.

(56) References Cited

U.S. PATENT DOCUMENTS

| | | | |
|---|---|---|---|
| 5,594,173 A | 1/1997 | Frey et al. | |
| 6,188,948 B1 | 2/2001 | Shivler, Jr. | |
| 8,818,740 B2 | 8/2014 | McCoy | |
| 8,818,749 B2 | 8/2014 | Friedrich et al. | |
| 9,465,683 B2 | 10/2016 | Slama et al. | |
| 2008/0053189 A1 | 3/2008 | Bell | |
| 2009/0051352 A1 | 2/2009 | Hoskins et al. | |

(Continued)

FOREIGN PATENT DOCUMENTS

WO    WO 2016/077066 A1    5/2016

OTHER PUBLICATIONS

U.S. Appl. No. 15/686,715; 29 pages. (filed Aug. 25, 2017).

(Continued)

*Primary Examiner* — Son T Le
(74) *Attorney, Agent, or Firm* — Charles R. Jacobsen

(57) ABSTRACT

A system includes a magnetic field sense element for detecting an external magnetic field and a magnetic field source proximate the magnetic field sense element for providing a reference magnetic field. The magnetic field sense element produces a composite signal having reference and measurement signal portions, the reference signal portion being indicative of the reference magnetic field and the measurement signal portion being indicative of the external magnetic field. A power supply provides a supply current through the magnetic field source for continuously generating the reference magnetic field while the system is in an operational mode. A processing circuit processes the composite signal to produce a measurement output signal indicative of the external magnetic field. A qualification circuit, coupled with the processing circuit at multiple test points, detects the reference signal portion at the multiple test points and determines operability of the system from the detected reference signal portion.

16 Claims, 8 Drawing Sheets

(56) References Cited

U.S. PATENT DOCUMENTS

| | | |
|---|---|---|
| 2012/0182658 A1 | 7/2012 | Motz |
| 2012/0194181 A1 | 8/2012 | Zhang |
| 2012/0268074 A1 | 10/2012 | Cooley et al. |
| 2014/0327435 A1 | 11/2014 | Rohrer |
| 2016/0004585 A1 | 1/2016 | Slama et al. |
| 2016/0139229 A1* | 5/2016 | Petrie .................... G01R 33/09 324/202 |
| 2016/0313413 A1 | 10/2016 | Mohan et al. |
| 2016/0320462 A1 | 11/2016 | Mather et al. |
| 2017/0092024 A1 | 3/2017 | Slama et al. |
| 2017/0033648 A1 | 11/2017 | Latham et al. |
| 2018/0011140 A1 | 1/2018 | Chaware et al. |
| 2018/0023977 A1 | 1/2018 | Park et al. |

OTHER PUBLICATIONS

Notice of Allowance; U.S. Appl. No. 15/686,715; 6 pages (dated Dec. 12, 2019).
Non Final Office Action; U.S. Appl. No. 15/686,715; 16 pages (dated Sep. 30, 2019).

* cited by examiner

US 10,677,620 B2

SYSTEM AND METHOD FOR SENSOR DIAGNOSTICS DURING FUNCTIONAL OPERATION

TECHNICAL FIELD OF THE INVENTION

The present invention relates generally to sensor systems. More specifically, the present invention relates to a magnetic field sensor system, such as a speed sensor, and methodology for continuously determining operability of the magnetic field sensor system for functional safety fault detection during functional operation.

BACKGROUND OF THE INVENTION

Magnetic field sensor systems are utilized in a variety of commercial, industrial, and automotive applications to measure magnetic fields for purposes of speed and direction sensing, rotation angle sensing, proximity sensing, and the like. In some applications, a magnetic field sensor system may be used as a wheel speed sensor for reading the speed of a vehicle's wheel rotation. Wheel speed sensors may be implemented within an anti-lock braking system (ABS). ABS is an automotive safety system that allows the wheels on a motor vehicle to maintain tractive contact with the road surface according to driver inputs while braking, thus preventing the wheels from locking up (ceasing rotation) and avoiding uncontrolled skidding.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns magnetic field sensor systems and methodology for continuously testing the operability of such magnetic field sensor systems during functional operation. More particularly, a magnetic field sensor system may be implemented as a wheel speed sensor system of an anti-lock braking system (ABS) application. In an ABS application, the wheel speed sensor system typically functions in either of an operational mode or a standby (e.g., a standstill) mode. In the operational mode, a magnetic sense element of the wheel speed sensor detects an external magnetic field indicative of the speed of an object, such as a vehicle. In the standstill mode, the vehicle is energized but is not currently moving. Therefore, the external magnetic field (e.g., a change in the external magnetic field) is not available for detection by the magnetic sense element. A magnetic field source, in proximity to the magnetic sense element of the speed sensor, continuously provides a reference magnetic field when the system is in both of the operational and standstill modes. The reference magnetic field, with defined amplitude and frequency, can be detected by the magnetic sense element to determine in-situ operability of the speed sensor system. That is, the entire signal path can be monitored during the functional operation of the magnetic field sensor system to identify device failures during operation and/or to detect sensitivity changes or drifts, excessive noise levels, and the like.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
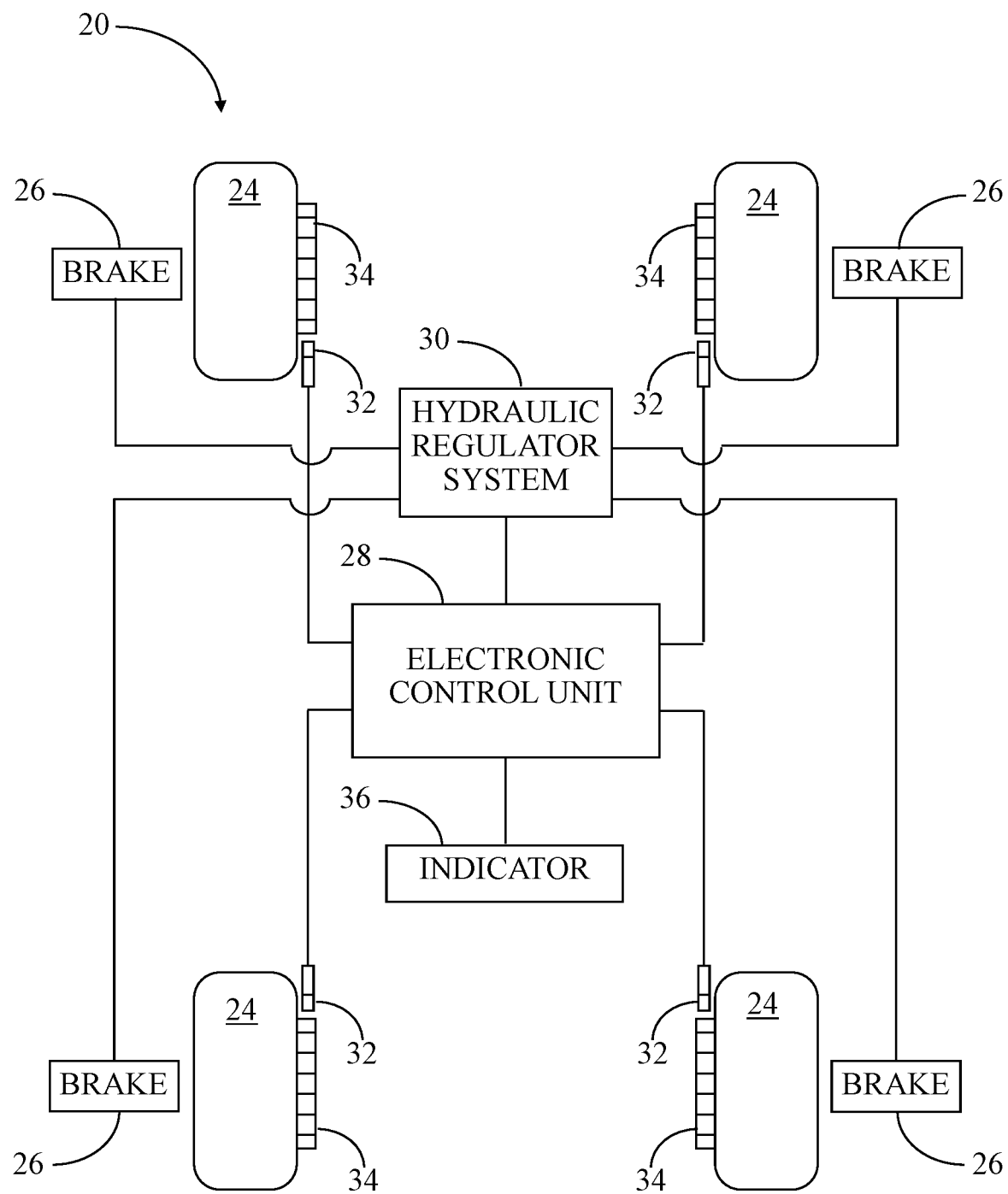
FIG. 1 shows a simplified block diagram of an anti-lock brake system.

Referring to FIG. 1, FIG. 1 shows a simplified block diagram of an anti-lock braking system (ABS) 20 for an object, such as a vehicle 22. As is known to those skilled in the art, a traction control system (TCS) may be provided on an anti-lock braking system. Thus, the term ABS used herein is intended to encompass an anti-lock braking system that may additionally include traction control capabilities. Vehicle 22 is not illustrated in detail herein for simplicity. Instead, vehicle 22 is represented by four wheels 24 and respective brakes 26 coupled thereto. Although four wheels 24 are shown, vehicle 22 may have any number of wheels 24.

In general, ABS 20 includes an ABS electronic control unit 28 communicatively coupled to a hydraulic regulator system 30. Electronic control unit 28 is additionally coupled to a plurality of wheel speed sensor systems 32. Hydraulic regulator system 30 can include any quantity and configuration of hydraulic valves, hydraulic pumps, hydraulic fluid reservoirs, and the like (not shown for simplicity) that are used to regulate brake actuated pressure supplied to brakes 26. In this example, each of the plurality of wheel speed sensor systems 32 is coupled to a respective wheel 24 and is configured to sense the rotational speed associated with respective wheel 24. In other configurations, an ABS may use any of a plurality of schemes differentiated by the number of channels (i.e. the quantity of valves that are individually controlled) and the number of speed sensors. These various configurations can include, for example, 1) four-channel, four-sensor ABS, 2) three-channel, four-sensor ABS, 3) three-channel, three-sensor ABS, 4) two-channel, four-sensor ABS, 5) one-channel, one-sensor ABS, and so forth.

Each wheel speed sensor system 32 may include a sensing portion in the form of one or more magnetic field sensors (not shown) that are configured to detect changes or disturbances in a magnetic field that has been created or modified, and from that derive information on the rotational speed of its associated wheel 24. To this end, ABS 20 may include a plurality of rotating encoder wheels 34, each of which is coupled to a respective wheel 24. Encoder wheels 34 are configured to facilitate sensing of the rotational speed of its respective wheel 24 through wheel speed sensor systems 32. By way of example, an external magnetic field can be detected as alternating magnetic north and south poles (not shown) of encoder wheel 34 passing by its associated wheel speed sensor system 32 during rotation of wheel 24. Wheel speed sensor system 32 may convert the pole-sequence into a pulsed output voltage, and the rotational speed of encoder wheel 34, and hence wheel 24, may be derived by counting the pulses per second. A bias magnet (not shown) may be used to adjust the sensitivity and measurement range of the magnetic field sensor. Encoder wheels 34 may be implemented as magnetized encoder wheels or encoder wheels 34 may be unmagnetized as in the case of passive encoders, or alternative embodiments may implement a ferromagnetic gear wheel or other similar structure.

Electronic control unit 28 constantly monitors the rotational speed of each wheel 24. If electronic control unit 28 detects one of wheels 24 rotating significantly slower than the other wheels, a condition indicative of impending wheel lock, electronic control unit 28 signals hydraulic regulator system 30 to reduce hydraulic pressure to brake 26 of the affected wheel 24. The reduction of hydraulic pressure reduces the braking force on that wheel 24 so that the wheel 24 rotates faster. Conversely, if the electronic control unit 28 detects one of wheels 24 rotating significantly faster than the other wheels 24, electronic control unit 28 signals hydraulic regulator system 30 to increase the hydraulic pressure to brake 26 of the affected wheel 24. The increase of hydraulic pressure increases the braking force on that wheel 24 so that the wheel 24 rotates slower. This process is repeated continuously such that wheels 24 of vehicle 22 equipped with ABS 20 are unlikely to lock even during panic braking in extreme conditions. If a fault develops in ABS 20, an indicator 36 coupled to electronic control unit 28 may inform the driver of the fault. For example, a warning light may be illuminated on the vehicle instrument panel, and ABS 20 may be disabled until the fault is rectified. ABS can significantly reduce the potential for loss of traction, skidding, hydroplaning, and so forth under heavy braking conditions.

It is essential to assure that the ABS remains functioning and to address problems with the ABS for maximum safety. In general, safety is the freedom from unacceptable risk of physical injury of people and/or of damage to property, and risk is a combination of the probability of occurrence of harm and the severity of that harm. Functional safety depends on a system or equipment operating correctly in response to its inputs. As such, functional safety may be considered as achieving absence of unreasonable risk due to hazards caused by malfunctioning behavior of electrical/electronic/programmable electronic systems. Functional safety of a system can be determined by, for example, fault avoidance and fault control. Fault avoidance addresses systemic failures caused by faults originating before system installation, whereas, fault control addresses hardware errors caused by faults originating after system installation.

In order to detect faults "in-situ" (i.e., after system installation), prior art magnetic field sensor systems implemented as speed sensors typically apply a periodic artificial electrical speedpulse signal at the sensor output that signals to a receiving electronic control unit that the application specific integrated circuit (ASIC) associated with the magnetic field sensor is functioning. Unfortunately, since the speedpulse signal is an artificially generated electrical output signal, it cannot be determined whether the magnetic sense element is suitably able to detect a magnetic field that is to be converted into an electrical output signal. Furthermore, in the absence of magnetic field conversion, the correct signal amplification, analog-to-digital conversion, filtering, offset correction, and the like cannot be detected. Thus, fault detection during this operating state is limited to the output stage. Additionally, electrical and magnetic offset drifts (e.g., over temperature) cannot be accurately detected and corrected.

Embodiments described herein enable magnetic field conversion with a magnetic sense element and monitoring of the entire signal processing chain with an ASIC-internally generated magnetic field. As will be described in greater detail below, defects within the signal processing chain can be detected. Therefore, permanent and/or intermittent lifetime failures which may be caused by physical defects occurring "in-situ" during functional operation or during standstill (and therefore cannot be detected by production tests) may be detected. Additionally, the conversion of the magnetic field into a well-defined electrical signal can be used to check for temperature dependent offset drift and for sensor sensitivity calibration. The following pertains to wheel speed sensor systems used for ABS applications. It should be understood, however, that systems and methodology described herein may in the same way be adaptable to other sensor systems.

Figure 2:
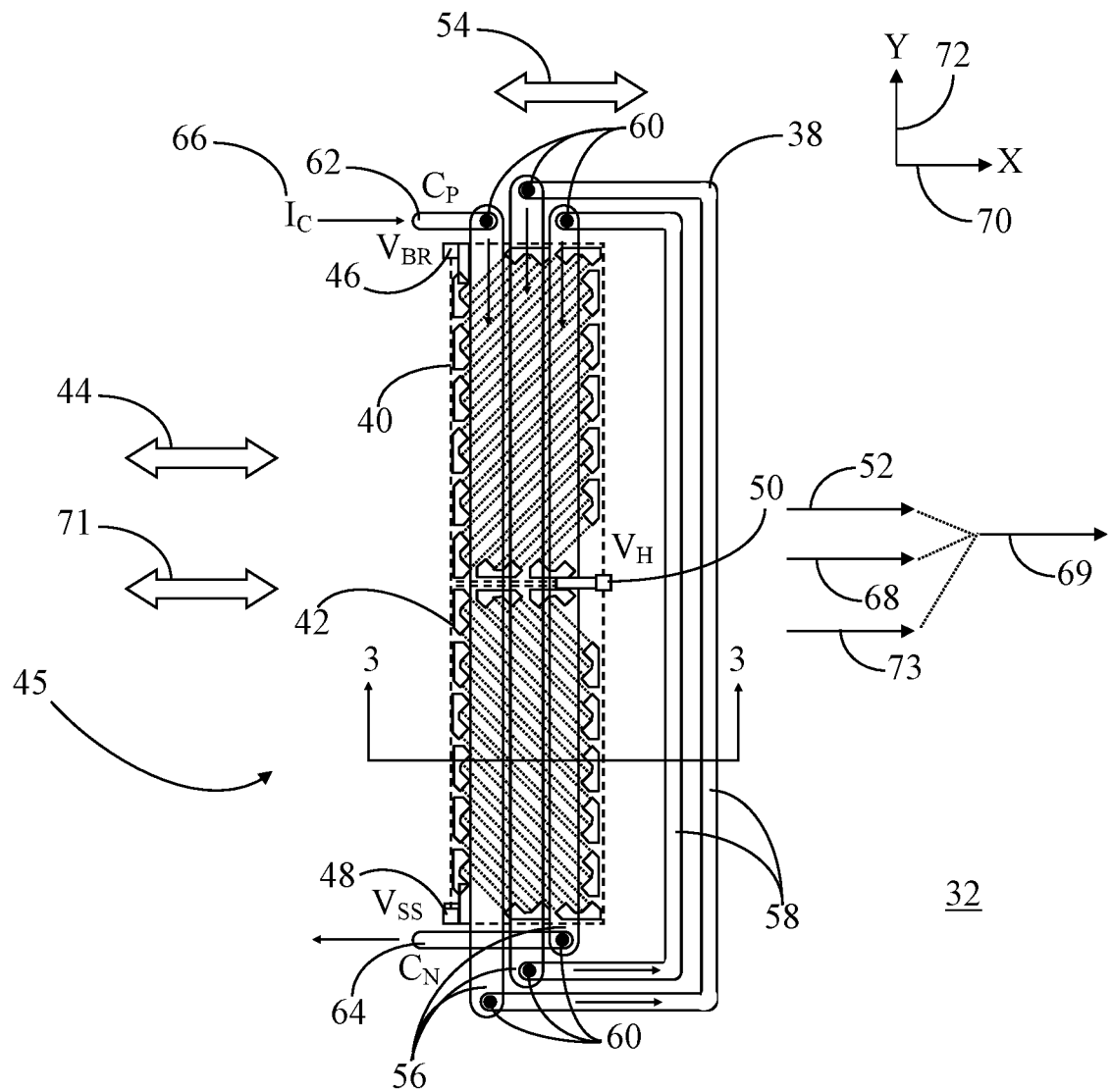
FIG. 2 shows a top view of a sensing portion of a wheel speed sensor system of the anti-lock brake system with a magnetic field source in accordance with an embodiment.
Figure 3:
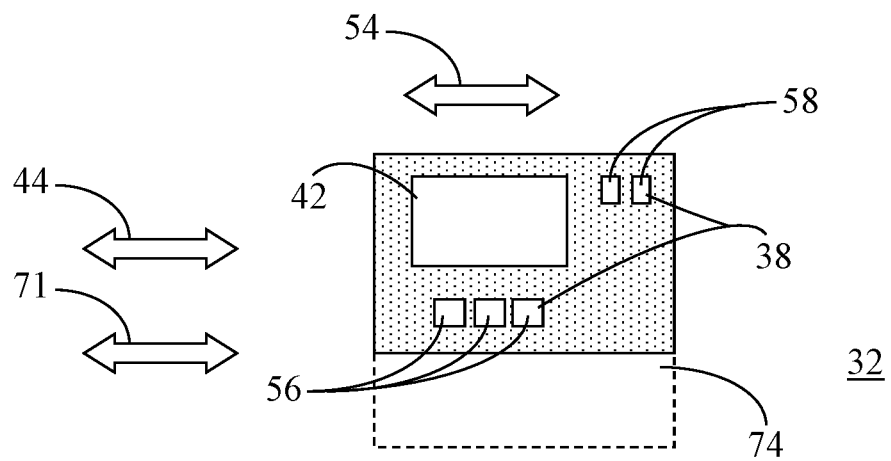
FIG. 3 shows a side sectional view of the sensing portion of the wheel speed sensor system and magnetic field source along section lines 3-3 of FIG. 2.

Referring to FIGS. 2-3, FIG. 2 shows a top view of a sensing portion of wheel speed sensor system 32 that includes a magnetic field source 38 in accordance with an embodiment and FIG. 3 shows a side sectional view of the sensing portion of wheel speed sensor system 32 and magnetic field source 38 along section lines 3-3 of FIG. 2. In this example, speed sensor system 32 includes a sensing portion in the form of a first magnetic field sense element 40 and a second magnetic field sense element 42 (each being delineated by a dashed line box in FIG. 1) configured to detect, i.e., sense, an external magnetic field 44 (oriented in a right-left direction on the page). First and second magnetic field sense elements 40, 42 may be anisotropic magnetoresistance (AMR) sense elements capable of changing the value of their electrical resistance in response to an externally-applied magnetic field. First magnetic sense element 40 includes nickel-iron (NiFe) stripes that are oriented positive forty-five degrees relative to a direction of external magnetic field 44 and second magnetic field sense element 42 includes NiFe stripes that are oriented negative forty-five degrees relative to the direction of external magnetic field 44. The orientation of the NiFe stripes may enable maximum sensitivity of first and second magnetic sense elements 40, 42 to external magnetic field 44. However, other angular orientations are also possible. Although AMR sense elements are mentioned herein. Alternative embodiments may include tunnel magnetoresistance (TMR) sense elements, giant magnetoresistance (GMR) sense elements, Hall effect sense elements, and so forth capable of detecting a magnetic field.

First and second magnetic sense elements 40, 42 may be connected in a half-bridge structure 45. Connection terminals include a $V_{BR}$ terminal 46, a $V_{SS}$ terminal 48, and a $V_H$ terminal 50. $V_{BR}$ terminal 46 may be connected to a regulated internal voltage supply (discussed below) and $V_{SS}$ terminal 48 may be connected to a system ground. $V_H$ terminal 50 is an output terminal for half-bridge structure 45 at which a first output signal 52 produced by half-bridge structure 45 of first and second magnetic sense elements 40, 42 in response to external magnetic field 44 is available for further processing to determine a current speed of vehicle 22 (FIG. 1).

In accordance with an embodiment, magnetic field source 38 includes an electrically conductive coil structure for providing an internal magnetic field, referred to herein as a reference magnetic field 54, that is generally oriented in the same direction as external magnetic field 44. Thus, magnetic field source 38 may alternatively be referred to herein as a coil structure 38. Coil structure 38 may include conductive, e.g., metallic, traces proximate first and second magnetic sense elements 40, 42. In the illustrated example, coil structure 38 may include a first set of traces 56 that are located directly below first and second magnetic sense elements 40, 42 (see FIG. 3) and a second set of traces 58 that are approximately co-planar with first and second magnetic sense elements 40, 42 and are laterally displaced away from first and second magnetic sense elements 40, 42 (see FIG. 3) to eliminate their influence on the reference magnetic field 54 generated by first set of traces 56. First and second sets of traces 56, 58 are connected with vias 60 at their end points to form coil structure 38.

Connection terminals to coil structure 38 include a $C_P$ terminal 62 and a $C_N$ terminal 64. Coil structure 38 may be arranged such that a coil current 66, represented by arrows overlaying traces 56, 58 flows through coil structure 38 from $C_P$ terminal 62 to $C_N$ terminal 64. Coil current 66 may be switched on and off and/or changed in polarity (discussed below). When coil structure 38 is energized, coil current 66, $I_C$, flows through coil structure 38 and generates reference magnetic field 54. This reference magnetic field 54 is detectable by first and second magnetic sense elements 40, 42. Thus, a second output signal 68 may be produced by half-bridge structure 45 of first and second magnetic sense elements 40, 42 in response to reference magnetic field 54.

As will be discussed in significantly greater detail below, coil current 66 may be switched on continuously when vehicle 22 (FIG. 2), hence ABS 20, is energized. Thus, reference magnetic field 54 can be continuously generated while first and second magnetic field sense elements 40, 42 are operational. Accordingly, half-bridge structure 45 of first and second magnetic sense elements 40, 42 is configured to produce a composite signal 69 as a combination of first and second output signals 52, 68. That is, composite signal 69 includes first output signal 52 (referred to hereinafter as a measurement signal portion 52) indicative of external magnetic field 44 and second output signal 68 (referred to hereinafter as a reference signal portion 68) superimposed on measurement signal portion 52 that is indicative of reference magnetic field 54. Composite signal 69 can be suitably processed (discussed below) to determine the operability of half-bridge structure 45 of first and second magnetic sense elements 40, 42 as well as the downstream signal processing chain.

Under some conditions, first and second magnetic field sense elements 40, 42 may be subject to a magnetic interference field, also referred to as a stray magnetic field, along non-sensing and sensing axes of a magnetic field sensor. Thus, composite signal 69 may further include a stray field signal portion 73 indicative of a stray magnetic field 71 along the sensing axis of first and second magnetic field sense elements 40, 42 and detectable by first and second magnetic field sense elements 40, 42. Stray magnetic field 71 may change the sensitivity and linearity range of the sensor, thus negatively affecting the magnetic field detection quality. Accordingly, composite signal 69 which further includes stray field signal portion 73 may be suitably processed (discussed below) to substantially reduce the adverse effects of stray field signal portion 73.

First and second sense elements 40, 42 are configured to measure external magnetic field 44 in a direction that is parallel to an X-axis 70 of a three-dimensional coordinate system. Accordingly, first and second sets of traces 56, 58 may be oriented approximately perpendicular to the direction of external magnetic field 44, and more particularly, first and second sets of traces 56, 58 are oriented in a lengthwise direction parallel to a Y-axis 72 of the three-dimensional coordinate system in order to generate reference magnetic field 54 that is also parallel to X-axis 70.

In the configuration shown in FIGS. 2-3, coil current 66 flows through a total of three traces of first set of traces 56 and through a total of two traces of second set of traces 58 to form three turns of coil structure 38. The first set of traces 56 located directly below first and second sense elements 40, 42 enables good magnetic field coupling to produce reference signal portion 68 in response to reference magnetic field 54. However, reference magnetic field 54 generated at second set of traces 58 (laterally displaced away from first and second sense elements 40, 42) has little or no influence on second output signal 68.

First and second sense elements 40, 42 and coil structure 38 may be fabricated on an application specific integrated circuit (ASIC) 74 (shown in dashed line form in FIG. 3) using, for example, top metal layers of ASIC 74. In the example shown, an alternating at high frequency seven milliampere (mA) coil current 66 may generate reference magnetic field 54 of approximately one hundred forty ampere/meter (A/m). However, the generated magnetic field strength of reference magnetic field 54 additionally depends on the layer distances, thickness, and area. Alternative embodiments may include more than or less than the three coil turns to obtain the required magnetic field strength of internal magnetic field. Still other embodiments may include a first set of traces directly above the magnetic sense elements and a second set of traces directly below the magnetic sense elements to further increase the magnetic field strength of internal magnetic field.

Wheel speed sensor system 32 includes two AMR magnetic sense elements 40, 42. It should be understood that alternative embodiments may employ tunnel magnetoresistance (TMR) magnetic sense elements, giant magnetoresistance (GMR) sense elements, and the like. Additionally, or alternatively, a wheel speed sensor may include more than two magnetic sense elements. For example, a wheel speed sensor may include two or more pairs of vertically stacked magnetic sense elements with coil structure 38 to form a more complex half-bridge structure (for example, to reduce or eliminate field gradients).

Figure 4:
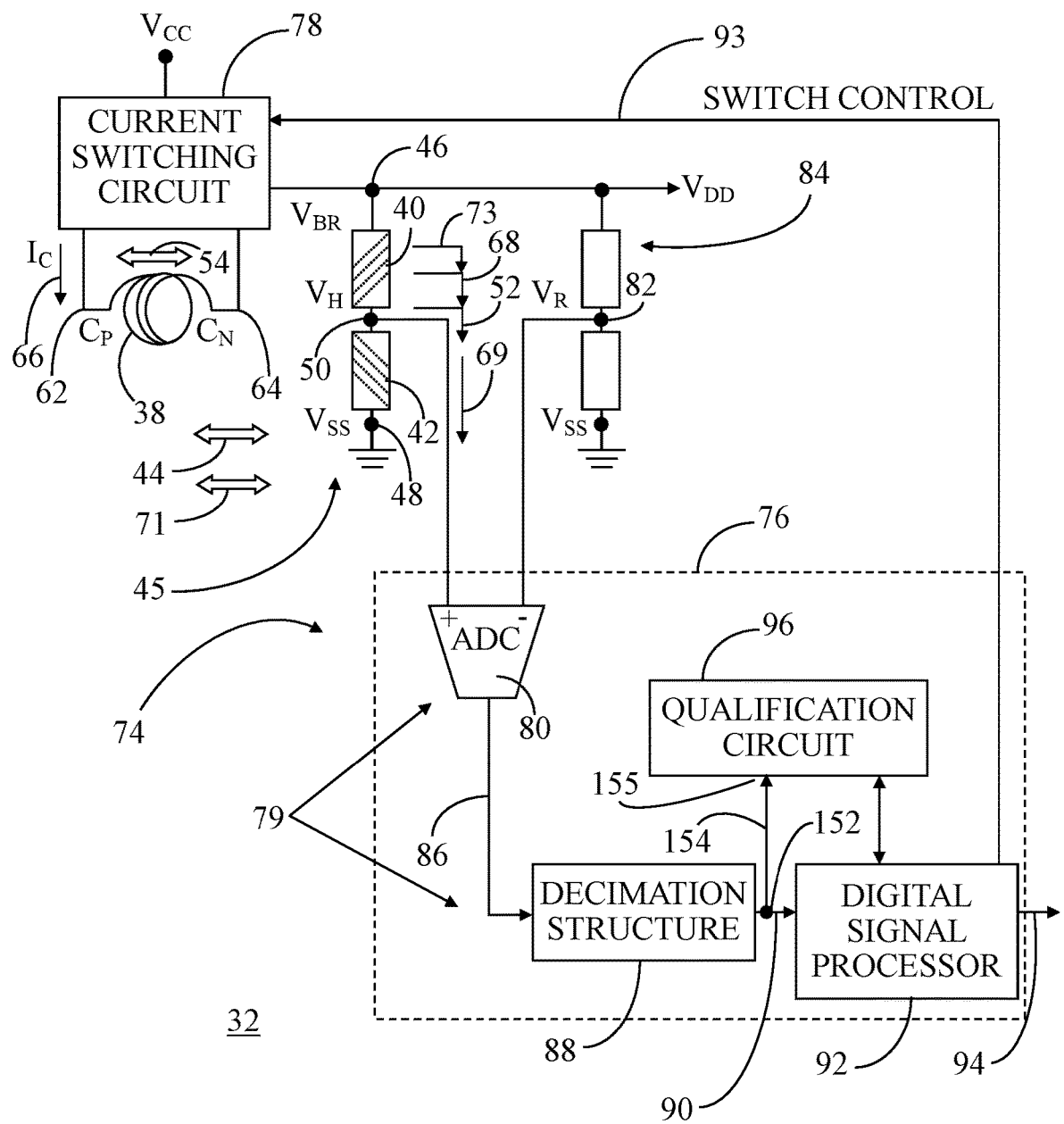
FIG. 4 shows a simplified block diagram of the wheel speed sensor system incorporating the magnetic field source for testing operability of the speed sensor system.

Referring now to FIG. 4, FIG. 4 shows a simplified block diagram of one of wheel speed sensor systems 32 incorporating the magnetic field source 38 (e.g., a coil structure) for testing operability of wheel speed sensor system 32. The block diagram of wheel speed sensor system 32 is provided to demonstrate the provision of coil current 66 to coil structure 38 and initiation of a signal flow of composite signal 69 through a signal processing chain of a processing circuit 76 (generally denoted by a dashed line box) of ASIC 74. Further description of the features of processing circuit are provided in connection with FIG. 6.

In general, wheel speed sensor 32 includes a current switching circuit 78 for providing controlled coil current 66 to coil structure 38 near first and second magnetic sense elements 40, 42 to generate reference magnetic field 54 (FIG. 2). Current switching circuit 78 will be described in greater detail in connection with FIG. 5. Wheel speed sensor 32 additionally includes half-bridge structure 45 of first and second magnetic sense elements 40, 42 formed on ASIC 74, as mentioned above. ASIC 74 may be an integrated circuit that is customized to function with half-bridge structure 45 of first and second magnetic sense elements 40, 42.

In an example configuration, ASIC 74 includes an analog-to-digital converter (ADC) system that includes, for example, a sigma-delta ADC. Sigma-delta ADC 80 is coupled to each of $V_H$ terminal 50 and a $V_R$ terminal 82 of a reference half-bridge structure 84. A magnetic field (e.g., external and reference magnetic fields 44, 54 of FIG. 2) is detected by half-bridge structure 45 of first and second magnetic sense elements 40, 42 and an output signal (e.g., composite signal 69) is fed into an input of ADC 80. In some embodiments, sigma-delta ADC 80 is configured to receive composite signal 69 and convert composite signal into a digitized intermediate composite signal 86. In general, sigma-delta ADC 80 includes an oversampling modulator that receives composite signal 69 and samples it multiple times, known as oversampling, to produce digitized intermediate composite signal 86. This approach can yield highly effective antialiasing filtering with high resolution.

ADC system 79 further includes a decimation structure 88. Decimation structure 88, sometimes referred to as a decimator or decimation filter, is coupled to an output of sigma-delta ADC 80. Following analog-to-digital conversion of composite signal 69 to digitized intermediate composite signal 86, decimation structure 88 receives digitized intermediate composite signal 86 and converts it into a high-resolution, slower digital code, referred to as downsampling. Decimation structure 88 may additionally include a low pass digital filter for removing high-frequency noise from digitized intermediate composite signal 86 prior to downsampling. Although ADC system 79 which includes sigma-delta ADC 80 and decimation structure 88 are discussed herein, other embodiments may implement different ADC techniques and structures.

Following bandwidth limitation (e.g., downsampling and/or low-pass filtering) at decimation structure 88, a data word (e.g., sixteen-bit and low-pass filtered), referred to herein as a digitized composite signal 90 corresponding to composite signal 69 may be output from decimation filter 88. Since digitized composite signal corresponds to composite signal 69, digitized composite signal 90 will also contain measurement signal portion 52, reference signal portion 68, and possibly stray field signal portion 73.

An input of a digital signal processor 92 formed in ASIC 74 may be coupled to an output of decimation structure 88 for receiving digitized composite signal 90. Additionally, an output of digital signal processor 92 may be coupled to current switching circuit 78 and may thus communicate a switch control signal 93 to current switching circuit 78. Switch control signal 93 may signal current switching circuit 78 to provide a constant supply current alternating at high frequency (e.g., coil current 66) through coil structure 38.

Digital signal processor 92 is coupled with half-bridge structure 45 of first and second magnetic sense elements 40, 42 via sigma-delta ADC 80 and decimation structure 88. Digital signal processor 92 is configured to process digitized composite signal 90 to produce a measurement output signal 94 indicative of the measured external magnetic field 44 (FIG. 1). A qualification circuit 96 may be formed in ASIC 74 and is coupled with an output of decimation structure 88 and with digital signal processor 92 at multiple test points (discussed below). Qualification circuit 96 is configured to detect reference signal portion 68 in digitized composite signal 90 at the multiple test points and determine an operability of at least a portion of wheel speed sensor system 32 from the reference signal portion 68 detectable at each of the multiple test points. As will be discussed in greater detail in connection with FIG. 6, qualification circuit 96 functions cooperatively with digital signal processor 92 to test the entire signal chain from detection of external magnetic field 44 through output of measurement output signal 94 and its subsequent communication to electronic control unit 28 (FIG. 1). Although a single half-bridge structure is discussed herein, other bridge structures may alternatively be implemented in connection with qualification circuit 96. For example, a differential bridge structure containing more than one described signal channel may be implemented to therefore eliminate stray field signal portion 73 of stray magnetic field 71.

Figure 5:
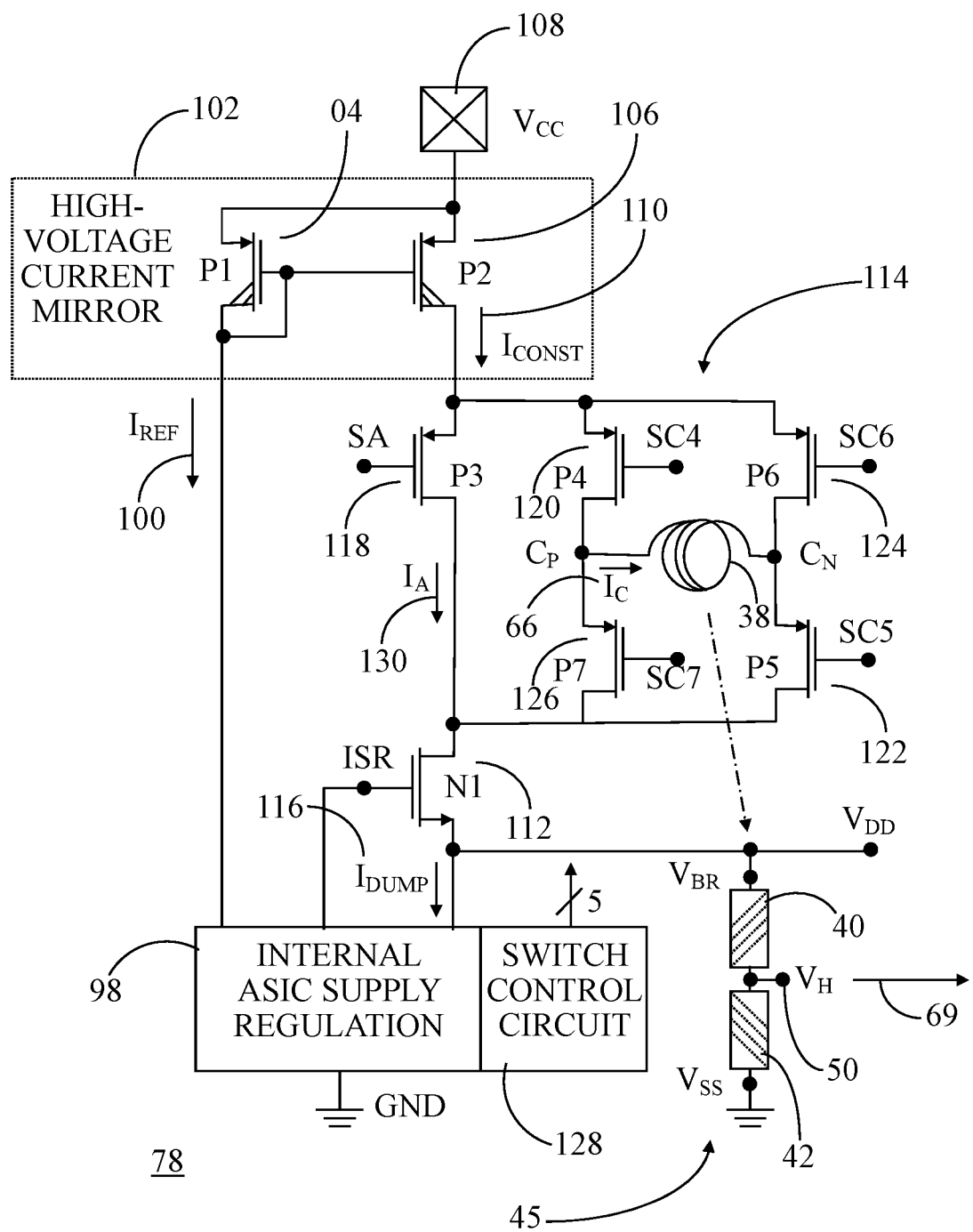
FIG. 5 shows a circuit diagram of an example configuration of a current switching circuit of the wheel speed sensor system of FIG. 4 for providing supply current through the magnetic field source of FIG. 2.

Referring now to FIG. 5, FIG. 5 shows a circuit diagram of an example configuration of current switching circuit 78 of speed sensor system 32 (FIG. 4) for providing supply coil current 66 through coil structure 38 (FIG. 2). An internal ASIC supply regulation block 98 generates a bandgap stable reference current 100, $I_{REF}$. Reference current 100 is fed to a high-voltage current mirror 102. In general, a current mirror is a circuit block which functions to produce a copy of the current in one active device by replicating the current in a second active device. A current mirror has a relatively high output resistance which helps to keep the output current constant, regardless of load conditions. High-voltage current mirror 102 may be built, for example, by high-voltage PMOS (HV-PMOS) transistors 104, 106, labeled P1 and P2 respectively, which decouples current switching circuit 78 from a voltage ($V_{CC}$) supply 108 and generates a constant supply current 110, labeled $I_{CONST}$, which can be used to power all active functional circuit components of ASIC 74 (FIG. 4). An NMOS transistor 112, labeled N1, decouples internal ASIC supply regulation block 98 from a coil switching circuit 114 of current switching circuit 78. Transistor 112, N1, ensures that all active functional blocks of ASIC 74 (FIG. 4) will be supplied and adds a regulated dump current 116, labeled hum, which is regulated and bypassed directly to ground (GND) to keep supply current 110 constant over the supply voltage 108 ($V_{CC}$), temperature, and alternating load conditions of the internal ASIC circuitry.

In an embodiment, coil switching circuit 116 includes five P-type MOS transistor devices (i.e., PMOS transistors) 118, 120, 122, 124, 126 (labeled P3, P4, P5, P6, P7, respectively) configured to switch constant supply current 110 through coil structure 38 or bypass coil structure 38. Transistors 118, 120, 122, 124, 126 are controlled by a switch control circuit 128. ASIC 74 can be supplied with constant supply current 110 when P3 transistor 118 is switched on (i.e., closed by switching SA to "low") and P4, P5, P6, P7 transistors 120, 122, 124, 126 are switched off (i.e., opened by switching SC4, SC5, SC6, SC7 to "high"). In this configuration, a current 130, labeled IA, is equivalent to constant supply current 110.

In order to generate reference magnetic field 54 (FIG. 2), a high frequency alternating coil current 66, labeled $I_C$, is needed in coil structure 38. When P3, P6, P7 transistors 118, 124, 126 are switched off (i.e., opened by switching SA, SC6, SC7 to "high") and P4, P5 transistors 120, 122 are switched on (i.e., closed by switching SC4, SC5) to "low"), constant supply current 110 will flow through coil structure 38 to generate a positive reference magnetic field component in the horizontal direction. Conversely, when P3, P4, P5 transistors 118, 120, 122 are switched off (i.e., opened by switching SA, SC4, SC5 to "high") and P6, P7 transistors 124, 126 are switched on (i.e., closed by switching SC6, SC7 to "low"), constant supply current 110 will flow through coil structure 38 in the opposite direction to generate a negative reference magnetic field component in the horizontal direction. To avoid voltage spikes during switching of the polarity of coil current 66, P3 transistor 118 may be closed briefly by switching SA to "low." This can also be used to smooth the edges for harmonics reduction. Still further, the constant supply current 66 through coil structure 38 may be faded on and off to avoid signal distortion. Thus, the frequency of alternating coil current switching will be at a higher frequency than the maximum specified signal frequency of the external magnetic field component (e.g., measurement signal portion 52 indicative of external magnetic field 44).

Half-bridge structure 45 of first and second magnetic sense elements 40, 42 is also shown in FIG. 5. The internally generated constant voltage, $V_{DD}$, supplies half-bridge structure 45 of first and second magnetic sense elements 40, 42 with its magnetic field sensitive NiFe stripes as well as the rest of ASIC 74. Accordingly, in a functional mode (e.g., either of operational or standstill modes) and through switch control provided via current switching circuit 78, the active ASIC 74 consumes a constant current 110 that is controlled by P1 and P2 transistors 104, 106. This constant current 110, as coil current 66, will additionally be used to supply coil structure 38. The voltage drop via coil structure 38 and the switches (i.e., transistors 118, 120, 122, 124, 126) should be kept low (for example, less than 200 mV). Therefore, wide metal lines for the first and second sets of traces 56, 58 (FIG. 2) and minimal coil turns may be beneficial. The ASIC current may be kept constant within ASIC 74 by another regulation loop (not shown).

Figure 6:
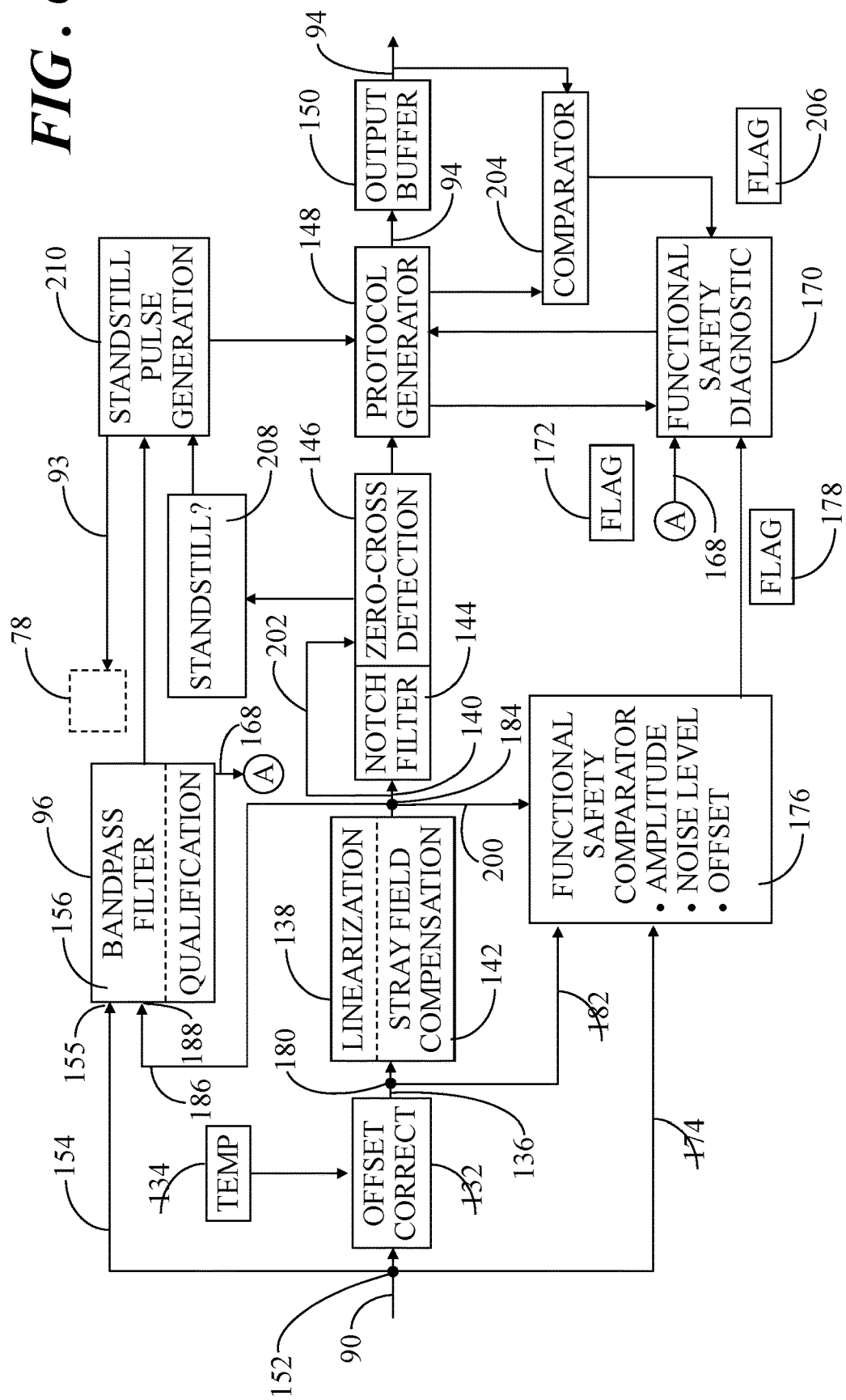
FIG. 6 shows a simplified block diagram of a processing circuit of the wheel speed sensor system of FIG. 4.

FIG. 6 shows a simplified block diagram of digital signal processor 92 of the wheel speed sensor system 32 (FIG. 4). The block diagram of FIG. 6 is provided to demonstrate multiple test points at which an operability of wheel speed sensor system 32 (FIG. 4) may be determined along the signal processing chain of digital signal processor 92. Thus, an example of the signal processing chain for producing measurement output signal 94 will first be described followed by a discussion of the multiple test points and qualification circuit 96 for determining operability of the signal processing chain.

As discussed above, following analog-to-digital conversion of composite signal 69 at sigma-delta ADC 80 (FIG. 4) and bandwidth limitation (e.g., downsampling and low-pass filtering) at decimation structure 88 (FIG. 4), digitized composite signal 90 (e.g., a data word) corresponding to composite signal 69 may be output from decimation structure 88. An input of a signal conditioning circuit (for example, an offset correction circuit 132) may be coupled to decimation structure 88 for receiving digitized composite signal 90 and compensating for a variable signal portion within digitized composite signal 90. In an example, a variable signal portion may be due to temperature variations experienced by wheel speed sensor system 32 (FIG. 4). Hence, offset correction circuit 132 may be configured to apply temperature compensation values 134 to digitized composite signal 90 (that includes reference signal portion 68 and stray field signal portion 73 superimposed on measurement signal portion 52 shown in FIG. 2) for offset and amplitude correction to yield a compensated composite signal 136. Since compensated composite signal 136 corresponds to digitized composite signal 90, compensated composite signal will also contain measurement signal portion 52, reference signal portion 68, and stray field signal portion 73.

An input of a linearization circuit 138 is in communication with an output of sigma-delta ADC 80 via the intervening decimation structure 88 and offset correction circuit 132. In general, linearization circuit 138 is configured to receive compensated composite signal 136 following offset and amplitude correction at offset correction circuit 132. Conversion of the magnetic excitation signal (e.g., external magnetic field 44, reference magnetic field 54, and stray magnetic field 71) into an electrical signal is typically non-linear and therefore can generate harmonic distortion components especially during saturation. Thus, linearization of this electrical signal may be needed. Accordingly, linearization circuit 138 is configured to process compensated composite signal 136 to produce a linearized composite signal 140 in which the harmonic distortion components of the signal path existing at the output of decimation structure 88 can be reduced. Additionally, linearization circuit 138 may include a stray field compensation section 142 configured to detect and correct for the presence of stray field signal portion 73 in compensated composite signal 136. Thus, in order to obtain accurate magnetic field detection under homogeneous external stray magnetic fields, sensor curve linearization is performed at linearization circuit 138 to produce linearized composite signal 140. Following linearization and stray field compensation at linearization circuit 138, linearized composite signal 140 will contain measurement signal portion 52 and reference signal portion 68, with stray field signal portion 73 being largely attenuated.

An output of linearization circuit 138 is in communication with a first filter element, referred to herein as a notch filter 144. Notch filter 144 is configured to receive linearized composite signal 140 and remove reference signal portion 68 from linearized composite signal 140 to obtain measurement signal portion 52. In an example configuration, reference signal portion 68 may be a 50 kHz signal (above a maximum specified signal frequency of the external magnetic field component) with a well-defined excitation field strength of +/−140 A/m. Since the amplitude and frequency of the artificially generated reference magnetic field 54 (FIG. 2) are well known, reference signal portion 68 can be readily filtered out of linearized composite signal 140 to separate measurement signal portion 52 from reference signal portion 68.

Notch filter 144 may be coupled to a zero-cross detection circuit 146. Zero-cross detection circuit 146 derives the zero-crossings of the output signal (e.g., the linearized and filtered data word) corresponding to measurement signal portion 54 to generate an excitation signal frequency dependent speedpulse output. These zero-crossings can be detected, for example, as alternating magnetic north and south poles (not shown) of encoder wheel 34 (FIG. 1). Thus, zero-cross detection circuit 146 can detect when wheel speed sensor system 32 (FIG. 4) is in an operational mode in which vehicle 22 is in motion and external magnetic field 44 (FIG. 2) can be detected. Similarly, zero-cross detection block 146 can detect when wheel speed sensor 32 is in a standstill mode in which the vehicle 22 may be energized, but vehicle 22 is not in motion. The standstill mode can occur following switch ignition and prior to movement of the vehicle 22, when the vehicle 22 is momentarily stopped at a stop sign or stop light, and/or under other conditions in which wheels 24 (FIG. 1) of vehicle 22 are not currently rotating.

Zero-cross detection block 146 is coupled with a protocol generator 148 of a digital core of ASIC 74 which may encode the speed and direction information according to a suitable digital output protocol (e.g., an AK protocol) to produce measurement output signal 94. The encoded speed and direction information (e.g., measurement output signal 94) is output via protocol generator 148 to a speedpulse output buffer 150 which switches its current between two levels (e.g., 7 mA and 14 mA) depending upon the signal polarity information. This measurement output signal 94 can thus be communicated to electronic control unit 28 (FIG. 1) of ABS 20.

In accordance with some embodiments, measurement of the physical signal, e.g., external magnetic field 44 (FIG. 1), can be monitored from detection at half-bridge structure 45 of first and second magnetic sense elements 40, 42 (FIG. 4) to output from speedpulse output buffer 150, within the ASIC-internally realized conversion channel during normal functional operation. Accordingly defects within the signal processing chain of ASIC 74 and performance degradation over the lifetime of wheel speed sensor system 32 may be detected. The performance degradation or lifetime failure of wheel speed sensor system 32 may be caused by physical hardware defects occurring during functional operation, which would not otherwise be detected during production testing. These defects may lead to statistical failure seen as parameter drifts or stuck-at faults, which can be safety critical within a particular application, such as within ABS 20 (FIG. 1).

As such, embodiments described herein provide for continuous fault monitoring with an ASIC-internally generated continuous magnetic excitation field (e.g., reference magnetic field 54) of known amplitude and fixed frequency. This reference magnetic field 54 stimulates half-bridge structure 45 of first and second magnetic sense elements 40, 42, and half-bridge structure 45 generates a well-defined output signal (e.g., reference signal portion 68) superimposed on measurement signal portion 52 from external magnetic field 44. This well-defined reference signal portion 68 can be used, for example, to monitor the operability of half-bridge structure 45 or its supply, sigma-delta ADC 80, decimation structure 88, offset correction circuit 132, linearization circuit 138 with stray field compensation section 142, zero-cross detection circuit 146, and so forth.

With reference concurrently to FIGS. 4 and 6, qualification circuit 96 is coupled to an output of decimation structure 88 at a test point 152. More particularly, an interconnect 154 is formed between an output of decimation structure 88 and a first input 155 of qualification circuit 96. At test point 152, digitized composite signal 90 (which includes measurement signal portion 52 and reference signal portion 68) is communicated to qualification circuit 96. At test point 152, the sensitivity of half-bridge structure 45 of first and second magnetic sense elements 40, 42 and signal clipping can be checked. The amplitude of the output signal (e.g., composite signal 69) from half-bridge structure 45 can be measured in relation to reference magnetic field 54 (FIG. 2) generated by the switched internal coil current 66. With this, it can be determined whether the sensor sensitivity is sufficiently as high as specified. Additionally, the performance of the analog-to-digital conversion at ADC 80 together with downsampling and filtering at decimation structure 88 can be checked behind decimation structure 88 by comparing the measured signal amplitude to the expected signal amplitude. An indication about the transfer function of wheel speed sensor system 32 at the excitation level of reference signal portion 68 can be given.

To achieve this, digitized composite signal 90 is communicated to qualification circuit 96 from test point 152 via interconnect 154. Qualification circuit 96 includes a second filter, referred to herein as a bandpass filter 156. Bandpass filter 156 removes the digitized measurement signal portion 52 from the digitized reference signal portion 68 by band-pass filtering the well-defined frequency band of reference signal portion 68 prior to determining the operability of at least the sensitivity of half-bridge structure 45, analog-to-digital conversion at ADC 80, and downsampling and filtering at decimation structure 88. In an example embodiment, the maximum input signal frequency of external magnetic field 44 may be limited to 12 kHz. The frequency of switching reference magnetic field 54, generated by coil structure 38, is synchronous to the internal data processing sample rate and should be at least a minimum of four times higher than the specific maximum signal frequency. Thus, an example frequency of switching reference magnetic field 54 may be 50 kHz, and bandpass filter 156 can be configured to pass frequencies in a suitable range centered at 50 kHz and reject frequencies outside of that range so as to effectively attenuate measurement signal portion 52 resulting from external magnetic field 44. To be independent from the temperature and process dependent propagation delay of a 50 kHz qualification reference signal portion, a moving average filter may be implemented at bandpass filter 96.

After bandpass filtering, qualification circuit 96 can evaluate the extracted qualification reference signal portion against an expected result within a defined guard band. Qualification circuit 96 should account for the signal shape (sine or rectangular) and the implemented attenuation of the qualification reference signal portion at decimation structure 88.

Figure 7:
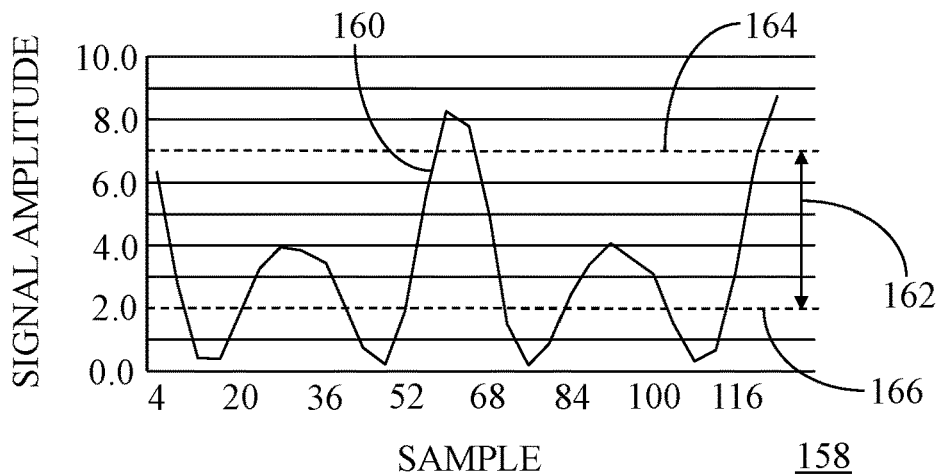
FIG. 7 shows a graph of a qualification reference signal portion following analog-to-digital (ADC) conversion, downsampling, and bandpass filtering of a composite signal within the system of FIGS. 4 and 6.

Referring to FIG. 7, FIG. 7 shows a graph 158 of an example of a digitized qualification reference signal portion 160 following analog-to-digital conversion, downsampling, and bandpass filtering within wheel speed sensor system 32 of FIGS. 4 and 6. More particularly, digitized qualification reference signal portion 160 results from filtering at bandpass filter 156 of qualification circuit 96 (in the example set forth, approximately 50 kHz) and is then further qualified within specified limits. The qualification of the 50 kHz digitized reference signal portion may use a moving average over multiple samples (e.g., 8 samples) of filtered 50 kHz digitized reference signal portion within qualification circuit 96 and further qualification procedures. Predetermined detection limits can be used to check the quality of 50 kHz digitized qualification reference signal portion 160 in amplitude and frequency pureness. In this simplified example, the predetermined detection limit following ADC and down-sampling is a first expected signal range 162 defined by an upper limit 164 and a lower limit 166. As shown in graph 158, some samples of digitized qualification reference signal portion 160 fall outside of first expected signal range 162 and may therefore indicate a fault within system 32.

With reference back to FIGS. 4 and 6, in some configurations, an interconnect 168 may be provided between qualification circuit 96 and a functional safety diagnostic circuit 170. Qualification circuit 96 may compare digitized qualification reference signal portion 160 (FIG. 7) to first expected signal range 162 (FIG. 7). If the expected result of digitized qualification reference signal portion 160 is not achieved within first expected signal range 162, qualification circuit 96 may raise an error flag 172 to signal a sensor measurement fault. Error flag 172 may be communicated to function safety diagnostic circuit 170 for further processing.

In some configurations, another interconnect 174 may be provided between test point 152 and a functional safety comparator circuit 176. Functional safety comparator circuit 176 may be associated with a nonvolatile memory element (not shown) that can be used to store information associated with expected signal values. For example, a noise level in digitized composite signal 90 at the output of decimation structure 88 (e.g., at test point 152) may be measured and compared by functional safety comparator circuit 176 with a theoretical expected noise level generated by the internal signal processing of ASIC 74 (e.g., due to thermal noise). If these noise levels exceed expected guard bands, an error flag 178 can be risen by functional safety comparator circuit 176 to signal an unexpected noise fault and this error flag 178 may also be communicated to functional safety diagnostic circuit 170. Unexpected noise could be caused by an external disturbing magnetic field or a broken component within the signal processing chain.

Thus, error flag 172 represents a communication from qualification circuit 96 to functional safety diagnostic circuit 170 signaling a sensor measurement fault. Similarly, error flag 178 represents a communication from functional safety comparator circuit 176 also signaling a sensor measurement fault. Accordingly, if 50 kHz digitized qualification reference signal portion 160 is not detected at test point 152 behind decimation structure 88 or falls outside of first expected signal range 162 or a theoretical expected noise level, a determination can be made that there is a fault with the generation of reference magnetic field 54, a fault with current switching at current switching circuit 78, a fault in coil structure 38, a fault with half-bridge structure 45 of first and second magnetic sense elements 40, 42 or the associated supply power, a fault with analog-to-digital conversion at ADC 80, and/or a fault with decimation structure 88.

Processing circuit 76 may include another test point 180 at an output of offset correction circuit 132. Test point 180 is in communication with functional safety comparator 176 via an interconnect 182. At test point 180, the electrical and magnetic offset correction over temperature can be checked if the temperature changes over time at a constant external magnetic excitation field. Offset correction may be needed in order to detect the zero crossing of a small signal amplitude within a short time, if the temperature has changed. This may be achieved by comparing the measured offset levels with stored reference values at functional safety comparator 176. Since compensated composite signal 136 output from offset correction circuit 132 includes reference signal portion 68 resulting from the internally generated reference magnetic field 54, the offset and amplitude correction over temperature can be monitored by calculating the median level of reference signal portion 68. If offset and amplitude correction over temperature is outside of expected signal levels stored, for example, in memory (not shown), error flag 178 can be risen by functional safety comparator circuit 176 and this error flag may be communicated to functional safety diagnostic circuit 170.

With continued reference to FIGS. 4 and 6, qualification circuit 96 is coupled to an output of linearization circuit 138 at a test point 184. More particularly, an interconnect 186 is formed between an output of linearization circuit 138 and a second input 188 of qualification circuit 96. At test point 184, linearized composite signal 140 (which includes measurement signal portion 52 and reference signal portion 68) is communicated to qualification circuit 96. At test point 184, the operability of linearization circuit 138 with stray field compensation section 142 can be checked.

To achieve this, linearized composite signal 140 is communicated to qualification circuit 96 from test point 140 via interconnect 186. Again, bandpass filter 156 removes the digitized measurement signal portion 52 from the digitized reference signal portion 68 by bandpass filtering the well-defined frequency band of reference signal portion 68 prior to determining the operability of at least linearization circuit 138 with stray field compensation section 142. After bandpass filtering, qualification circuit 96 can evaluate an extracted linearized qualification reference signal portion against an expected result within a defined guard band.

Figure 8:
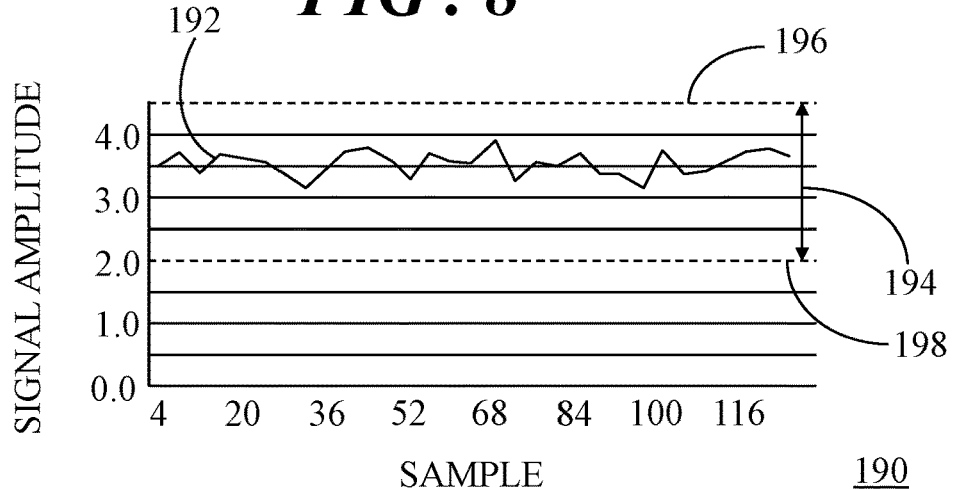
FIG. 8 shows a graph of a qualification reference signal portion following linearization, stray magnetic field compensation, and bandpass filtering of a composite signal within the system of FIGS. 4 and 6.

Referring to FIG. 8, FIG. 8 shows a graph 190 of an example of a linearized qualification reference signal portion 192 following linearization, stray magnetic field compensation, and bandpass filtering within wheel speed sensor system 32 of FIGS. 4 and 6. More particularly, linearized qualification reference signal portion 192 results from filtering at bandpass filter 156 of qualification circuit 96 (in the example set forth, about approximately 50 kHz) and is then further qualified within specified limits. The qualification of the 50 kHz linearized reference signal portion may use a moving average over multiple samples (e.g., 8 samples) of filtered 50 kHz linearized reference signal portion within qualification circuit 96 and further qualification procedures. Predetermined detection limits can be used to check the quality of 50 kHz linearized qualification reference signal portion 192 in amplitude and frequency pureness. In this simplified example, the predetermined detection limit following linearization and stray field compensation is a second expected signal range 194 defined by an upper limit 196 and a lower limit 198. If some or all samples of linearized qualification reference signal portion 192 fall outside of second expected signal range 194, than a fault may be occurring within wheel speed sensor system 32.

With reference back to FIGS. 4 and 6, if the expected result of linearized qualification reference signal portion 192 is not achieved within second expected signal range 194, qualification circuit 96 may raise error flag 172 to signal a sensor measurement fault with regard to linearization and stray field compensation. Error flag 172 may then be communicated to functional safety diagnostic circuit 170 via interconnect 168 for further processing.

In some configurations, another interconnect 200 may be provided between test point 184 and a functional safety comparator circuit 176. Functional safety comparator circuit 176 may evaluate a noise level in linearized composite signal 140 at the output of linearization circuit 138 (e.g., at test point 184). If these noise levels exceed expected guard bands, error flag 178 can be risen by functional safety comparator circuit 176 to signal an unexpected noise fault and this error flag 178 may also be communicated to functional safety diagnostic circuit 170.

Thus, error flag 172 represents a communication from qualification circuit 96 to functional safety diagnostic circuit 170 signaling a sensor measurement fault. Similarly, error flag 178 represents a communication from functional safety comparator circuit 176 to functional safety diagnostic circuit 170 also signaling a sensor measurement fault. Accordingly, if 50 kHz linearized qualification reference signal portion 192 (FIG. 8) is not detected at test point 184 behind linearization circuit 138 or falls outside of second expected signal range 194 (FIG. 8) or a theoretical expected noise level, a determination can be made that there is a fault upstream from test point 184. That is, there may be a fault with at least linearization at linearization circuit, compensation at stray field compensation section 142, and/or offset correction at offset correction circuit 132. Further, there may be a fault with the generation of reference magnetic field 54, with current switching at current switching circuit 78, a fault in coil structure 38, a fault with half-bridge structure 45 of first and second magnetic sense elements 40, 42 or the associated supply power, a fault with analog-to-digital conversion at ADC 80, and/or a fault with decimation structure 88.

It should be understood that at test points 152 and 184, qualification circuit 96 filters the associated composite signals 90, 140 to attenuate the measurement signal portion and evaluate the reference signal portion to qualify operability of the system in response to the reference signal portion. Qualification circuit 96 can check for sensor sensitivity and signal clipping behind decimation structure 88 at test point 152, and qualification circuit 96 can check for sensor curve linearization and stray field compensation at test point 184. Additionally, at test points 152, 180, 184, functional safety comparator 176 evaluates the composite signal that includes measurement signal portion 52 and reference signal portion 68 to identify operability of the system in response to the composite signal. For example, functional safety comparator 176 may check for signal amplitude, noise levels, offset correction, and so forth.

Functional safety diagnostic circuit 170 may be in communication with protocol generator 148. Thus, if flag 172 or flag 178 is communicated from qualification circuit 96 or functional safety comparator 176 to functional safety diagnostic circuit 170, protocol generator 148 may encode the error information represented by flag 172 or flag 178 according to the digital output protocol for communication to electronic control unit 28.

As discussed previously, an output of linearization circuit 138 is in communication with a notch filter 144. Notch filter 144 is configured to receive linearized composite signal 140, which includes reference signal portion 68 and measurement signal portion 52, and remove reference signal portion 68. If measurement signal portion 52 is detected at zero-cross detection circuit 146 and no flags 172, 176 have been raised, it can be presumed that the upstream signal processing prior to notch filter 144 is operating properly. However, at zero-cross detection circuit 146, if measurement signal portion 52 is not detected at zero-cross detection circuit 146, vehicle 22 (FIG. 1) could be in the standstill mode or there could be a fault in the signal processing chain.

When measurement signal portion 52 is not detected at zero-cross detection circuit 146, the linearized and filtered digitized reference signal portion will be communicated to zero-cross detection circuit 146 via a bypass interconnect 202 between linearization circuit 138 and zero-cross detection circuit 146, bypassing notch filter 144. For example, notch filter 144 may be switched off. No detection of reference signal portion 68 for a predetermined duration of time indicates a fault in the processing signal chain. Detection of reference signal portion 68 indicates that vehicle 22 is in the standstill mode. Because the detected reference signal portion 68 is synchronous with the internal data processing it will be detected as an "internal signal" (i.e., the reference signal and not an external excitation signal). Thus, in some embodiments, the wheel speed sensor output protocol may be switched to the standstill protocol (discussed below).

Detection of linearized composite signal 140 (that includes measurement signal portion 52 plus reference signal portion 68) within the predetermined duration of time indicates that the external excitation signal is recovering (e.g., moving from standstill to functional modes). Under such a condition, notch filter 144 can be switched on again so that linearized composite signal 140 can be suitably processed and normal functional operation is resumed.

Figure 9:
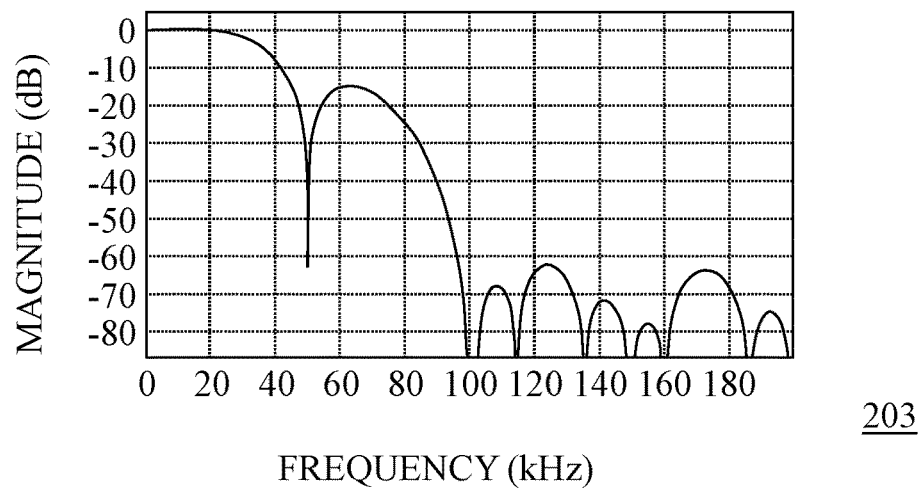
FIG. 9 shows a graph of a notch filter scheme for removing the reference signal from an external measurement signal within the system of FIGS. 4 and 6.

FIG. 9 shows a graph 203 of a notch filter scheme for removing the reference signal from an external measurement signal within wheel speed sensor system 32 (FIGS. 4 and 6). Reference magnetic field 54 (FIG. 4) may be generated having a known amplitude and frequency. In the example described previously, reference magnetic field 54 may have an amplitude of +/−140 A/m at a frequency of 50 kHz. Accordingly, notch filter 144 (FIG. 6) may be configured to filter out or otherwise attenuate the reference signal portion 68 and at least some of its harmonics such that measurement signal portion 52 remains for zero-cross detection.

With reference back to FIG. 6, another comparator circuit 204 may be coupled with an output of speedpulse output buffer 150. Comparator circuit 204 may receive the encoded speed and direction information (e.g., measurement output signal 94) from speedpulse output buffer 150. If an expected result of measurement output signal 94 is not achieved within a defined guard band referred to by protocol generator 148, an error flag 206 may be raised and communicated to functional safety control circuit 170 to signal a sensor measurement or communication fault. Protocol generator 148 may encode the error information associated with error flag 206 according to the digital output protocol for communication to electronic control unit 28. Thus, fault detection of speedpulse output buffer 150 may be achieved with error flag 206.

It should be further observed that an output of zero-cross detection circuit 146 may be in communication with a standstill detection circuit 208. Standstill detection block 208 identifies from information output by zero-cross detection circuit 146 whether wheel speed sensor 32 is in the operational mode (in which zero-cross detection block 92 detects zero crossings of measurement signal portion 52 thus indicating that vehicle 22 is in motion) or whether wheel speed sensor 32 is in the standstill mode (in which zero-cross detection block 92 detects zero crossings of reference signal portion 68 thus indicating that vehicle 22 is not in motion). Standstill detection circuit 208 may be coupled with a standstill pulse generation circuit 210.

Standstill pulse generation circuit 210 may generate and communicate a standstill protocol via protocol generator 148 and speedpulse output buffer 150 to the output for communication to, for example, electronic control unit 28 (FIG. 1). The standstill protocol can indicate to electronic control unit 28 that vehicle 22 is in the standstill mode in which vehicle 22 is energized, but vehicle 22 is not in motion. Therefore, external magnetic field 44 is not available for detection by wheel speed sensor system 32. Nevertheless, while in the standstill mode, switch control signal 93 is communicated to current switching circuit 78 to provide the constant supply current (e.g., coil current 66) through coil structure 38.

Figure 10:
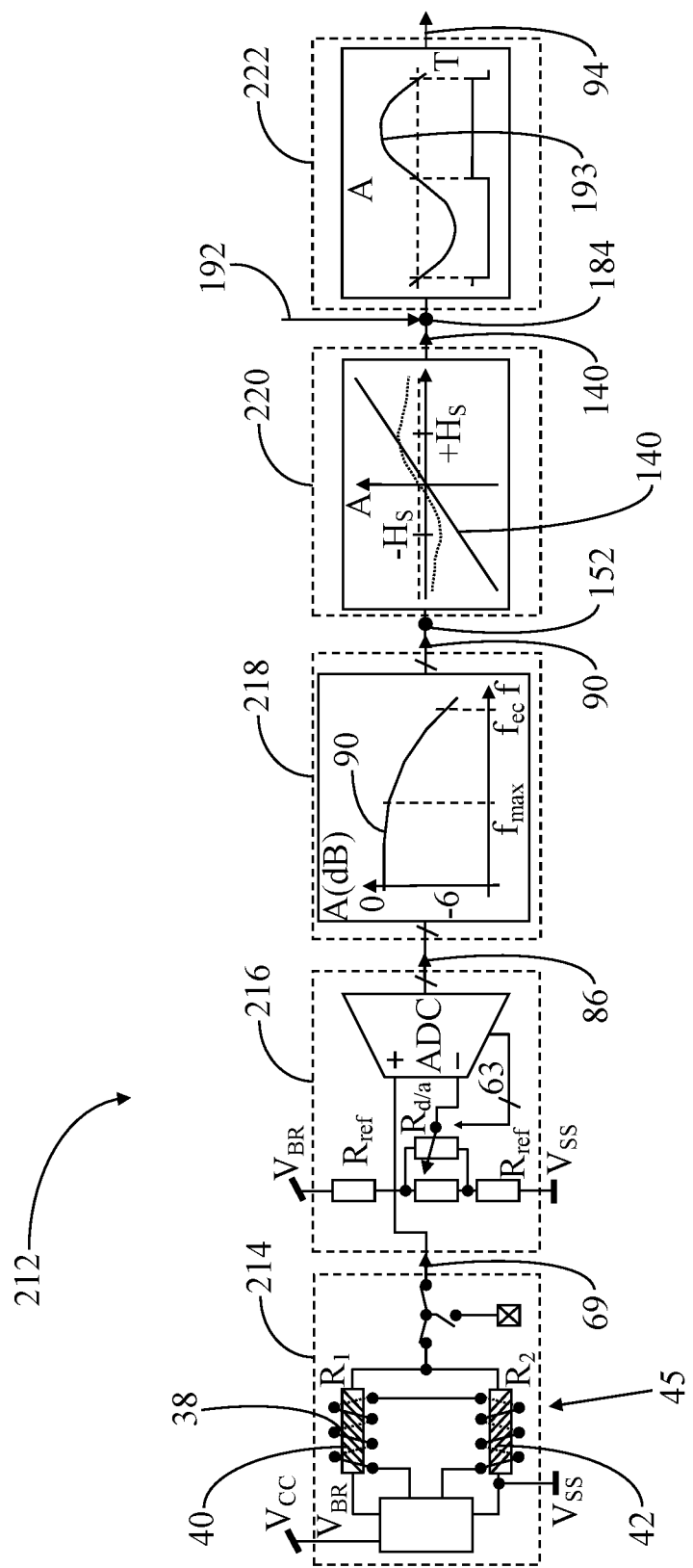
FIG. 10 shows an example of a signal processing chain for the wheel speed sensor system of FIG. 4.

FIG. 10 shows an example of a signal processing chain 212 for wheel speed sensor system 32 (FIG. 4). Further, signal processing chain 212 demonstrates the primary stages of processing and the various test points discussed above for determining operability of system 32.

At a first stage 214 of signal processing chain 212, system 32 (FIG. 4) is energized and coil current 66 is applied to coil structure 38 to provide reference magnetic field 54 (FIG. 4). At first stage 214, external magnetic field 44 (FIG. 4) can be detected by half-bridge structure 45 of first and second magnetic sense elements 40, 42. Composite signal 69 is output from first stage 214 of signal processing chain 212. At a second stage 216 of signal processing chain 212, composite signal 69 is digitized via sigma-delta ADC 80 to produce digitized intermediate composite signal 86. At a third stage 218 of signal processing chain 212, digitized intermediate composite signal 86 undergoes processing at decimation structure 88 (FIG. 4) to produce digitized composite signal 90. An output of decimation structure 88 is connected to an input of qualification circuit 96 (FIG. 6) at test point 152. At test point 152, system 32 can be checked for operability of at least the generation of reference magnetic field 54, current switching that yields coil current 66, coil structure 38, half-bridge structure 45 of magnetic sense elements 40, 42, analog-to-digital conversion at sigma-delta ADC 80, and decimation structure 88 (FIG. 4).

At a fourth stage 220 of signal processing chain 212, digitized composite signal 90 has undergone offset correction, linearization, and stray field compensation to yield linearized composite signal 140. An output of linearization circuit 138 (FIG. 6) is connected to an input of qualification circuit 96 at test point 184. At test point 184, system 32 can be checked for operability of at least offset correction at offset correction circuit 132 (FIG. 6) and linearization and stray field compensation at linearization circuit 138, as well as the generation of reference magnetic field 54, current switching that yields coil current 66, coil structure 38, half-bridge structure 45 of magnetic sense elements 40, 42, analog-to-digital conversion at sigma-delta ADC 80, and decimation structure 88.

At a fifth stage 222 of signal processing chain 212, linearized composite signal 140 has undergone zero-cross detection at zero-cross detection circuit 146 (FIG. 6) to yield measurement output signal 94. More particularly, linearized composite signal 140 is filtered via notch filter 144 to yield a linearized digitized measurement signal portion 193. If no zero crossings of digitized measurement signal portion 193 are detected, digitized reference signal portion 68 undergoes zero-cross detection at zero-cross detection circuit 146 to determine operability of at least notch-filter 144 (FIG. 6), zero-cross detection circuit 146, as well as offset correction at offset correction circuit, linearization and stray field compensation, the generation of reference magnetic field 54, current switching that yields coil current 66, coil structure 38, half-bridge structure 45 of magnetic sense elements 40, 42, analog-to-digital conversion at sigma-delta ADC 80, and decimation structure 88.

Figure 11:
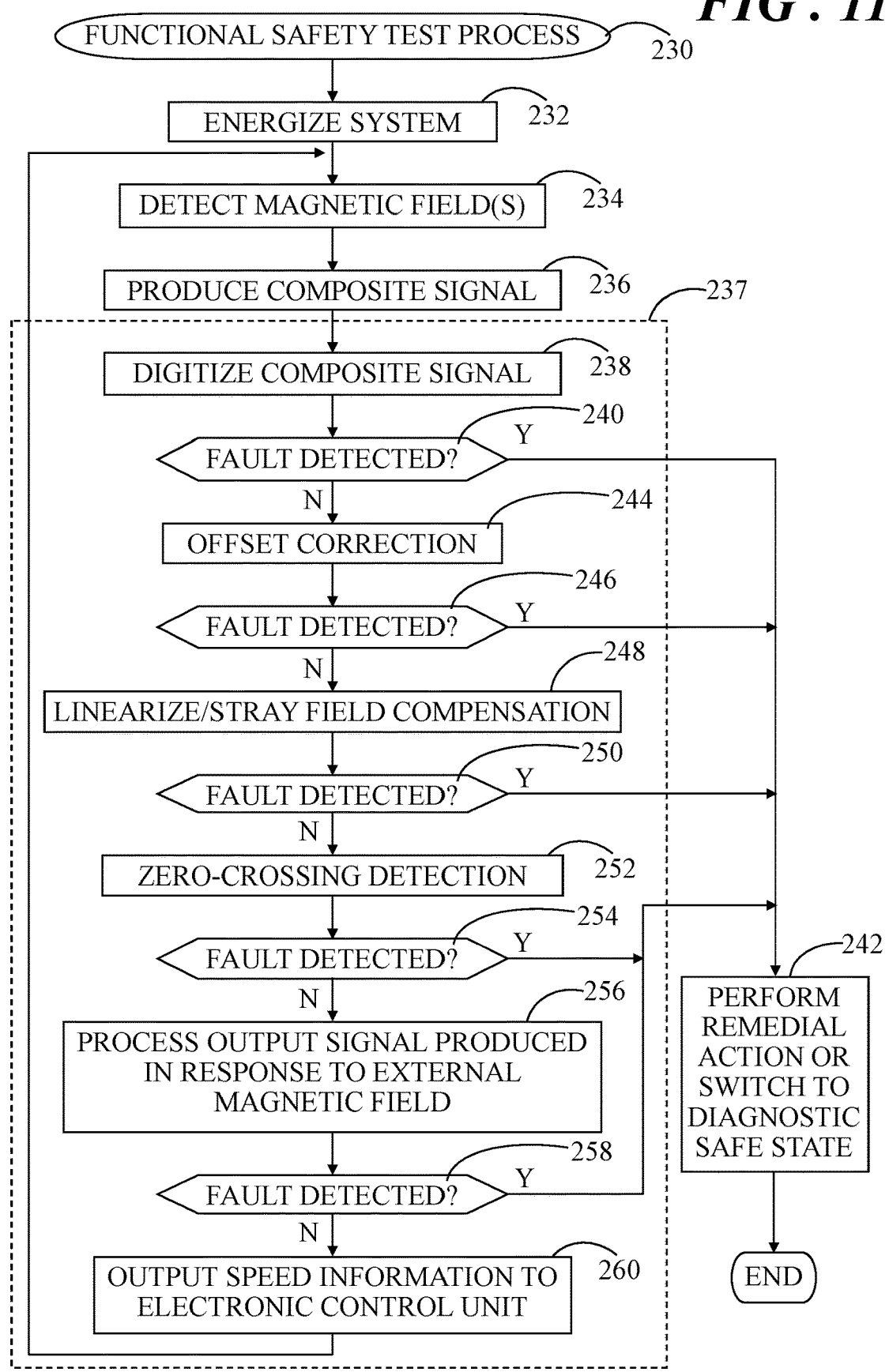
FIG. 11 shows flowchart of a functional safety test method implemented within the wheel speed sensor system of FIG. 4.

FIG. 11 shows flowchart of a functional safety test process 230 implemented within wheel speed sensor system 32. Functional safety test process 230 is performed "in-situ." That is, process 230 is executed when wheel speed sensor system 32 is incorporated in an end use application, such as in ABS 20, and is capable of functioning in the end use application in either of an operational mode and a standby (e.g., standstill) mode. Thus, functional safety test process 230 may be automatically executed whenever vehicle 22 (FIG. 1), and thus ABS 20 with wheel speed sensor system 32 is energized, i.e., when the ignition of vehicle 22 is turned on. Process 230 is described in connection with the functions of wheel speed sensor 32 (FIGS. 4 and 6). Accordingly, reference may be made concurrently to the block diagrams of FIGS. 4 and 6. Although functional safety test process 230 is described in connection with one of wheel speed sensor systems 32, it should be understood that functional safety test process 230 may be executed concurrently at each of wheel speed sensor systems 32 of ABS 20 (FIG. 1).

At a block 232, system 32 is energized. That is, vehicle 22 may be turned on such that system 32 is provided with power via current switching circuit 78. Accordingly, the magnetic field source (e.g., coil structure 38) located proximate half-bridge structure 45 of first and second magnetic field sense elements 40, 42 is also energized in order to provide reference magnetic field 54.

At a block 234, half-bridge structure 45 of first and second magnetic field sense elements 40, 42 detect magnetic fields. More particularly, half-bridge structure 45 may detect external magnetic field 44, reference magnetic field 54, and stray field magnetic field 71. At a block 236, half-bridge structure 45 produces composite signal 69 having measurement signal portion 52, reference signal portion 68, and potentially stray field signal portion 73. Measurement signal portion 52 is indicative of external magnetic field 44, reference signal portion 68 is indicative of reference magnetic field 54, and stray field signal portion 73 is indicative of stray magnetic field 71.

In response to the detection of magnetic fields 234, composite signal 69 is processed at processing circuit 76 (the processing operations being denoted by a dashed line box 237 in FIG. 11) nominally to produce measurement output signal 94 indicative of external magnetic field 44. However, various checks (discussed below) are executed in connection with functional safety test process 230 to ensure the operability of wheel speed sensor system 32. Thus, the operational blocks are described in connection with normal operational function (i.e., what should be occurring), and query blocks are interspersed with the operational blocks and generally correspond with test points and comparator operations within system 32 to test the operability of system 32. The operational and query blocks executed by processing circuit 76 to produce measurement output signal 94 or to determine operability of wheel speed sensor system 32 are denoted by dashed lines encircling those operational blocks.

Accordingly, at a block 238, composite signal 69 is digitized at sigma-delta ADC 80 and suitably processed at decimation structure 88 to produce digitized composite signal 90. At a query block 240, a determination is made as to whether a fault is detected. Query block 240 corresponds with test point 152 at which digitized composite signal 90 is communicated to qualification circuit 96, is filtered at bandpass filter 96 to detect digitized qualification reference signal portion 160 (FIG. 7) of reference signal portion 68 in digitized composite signal 90, and error flag 172 is produced when digitized qualification reference signal portion 160 is outside of the expected signal range 162 (FIG. 7).

When a fault is detected at query block 240, process 230 proceeds to a block 242. At block 242, remedial action may be performed to improve the operability of wheel speed sensor system 32 and/or wheel speed sensor system 32 flags electronic control unit 28 (FIG. 1) to switch ABS 20 into a diagnostic safe state if the signal path is not working correctly.

When a determination is made at query block 240 that no fault is detected, functional safety test process 230 continues with a block 244. At block 244, digitized composite signal undergoes offset correction at offset correction circuit 132 to produce compensated composite signal 136. At a query block 246, a determination is made as to whether a fault is detected. Query block 246 corresponds with test point 180 at which functional safety comparator 176 may evaluate compensated composite signal 136 for amplitude, noise level, offset, and so forth. When a fault is detected at query block 246, process 230 again proceeds to block 242 to perform remedial action or to switch ABS 20 into a diagnostic safe state.

When a determination is made at query block 246 that no fault is detected, functional safety test process continues with a block 248. At block 248, compensated composite signal 136 undergoes linearization and stray field compensation at linearization circuit 138 to produce linearized composite signal 140. At a query block 250, a determination is made as to whether a fault is detected. Query block 250 corresponds with test point 184 at which linearized composite signal 140 is communicated to qualification circuit 96, is filtered at bandpass filter 96 to detect linearized qualification reference signal portion 192 (FIG. 8) of reference signal portion 68 in linearized composite signal 140, and error flag 172 is produced when linearized qualification reference signal portion 192 is outside of the expected signal range 194 (FIG. 8). When a fault is detected at query block 250, process 230 again proceeds to block 242 to perform remedial action or to switch ABS 20 into a diagnostic safe state.

When a determination is made at query block 250 that no fault is detected, functional safety test process 230 continues with a block 252. At block 252, linearized composite signal 140 undergoes zero-cross detection. More particularly, linearized composite signal 140 is filtered at notch filter 144 to remove the digitized reference signal portion 68 and produce a measurement signal portion 193 (FIG. 10). The linearized digitized measurement signal portion 193 is processed at zero-cross detection circuit 146 in order to detect zero crossings indicative of the sensed external magnetic field 44, which would indicate that vehicle 22 is in motion. If zero-cross detection circuit 146 does not detect zero crossings in the digitized measurement signal portion 193, digitized reference signal portion 68 is communicated to zero-cross detection circuit 146 via bypass interconnect 202 (FIG. 8), thus bypassing notch filter 144. Thereafter, the digitized and linearized reference signal portion 68 undergoes zero-cross detection in order to detect zero crossings indicative of the alternating reference magnetic field 54.

Process 230 continues with a query block 254. At query block 254, a determination is made as to whether a fault is detected. Query block 254 corresponds with zero-cross detection circuit 146 detecting either zero crossings in the linearized measurement signal field (e.g., vehicle 22 is in motion) or zero crossings in the linearized reference signal portion 68 (e.g., vehicle 22 is in the standstill mode). When a fault is detected at query block 254, process 230 again proceeds to block 242 to perform remedial action or to switch ABS 20 into a diagnostic safe state.

When a determination is made at query block 254 that no fault is detected, functional safety test process 230 continues with a block 256. At block 256, the linearized measurement signal portion is processed at protocol generator 148, which encodes the speed and direction information according to a suitable digital output protocol (e.g., an AK protocol) to produce measurement output signal 94. The encoded speed and direction information (e.g., measurement output signal 94) is output via protocol generator 148 to speedpulse output buffer 150. At a query block 258, a determination is made as to whether a fault is detected. In an example, comparator circuit 204 may receive the encoded speed and direction information (e.g., measurement output signal 94) from speedpulse output buffer 150. If an expected result of measurement output signal 94 is not achieved within a defined guard band, error flag 206 is communicated to functional safety control circuit 170 to signal a sensor measurement or communication fault. When a fault is detected at query block 258, process 230 again proceeds to block 242 to perform remedial action or to switch ABS 20 into a diagnostic safe state.

When a determination is made at query block 258 that no fault is detected, process 230 continues with a block 260. At block 260, measurement output signal 94 is communicated to electronic control unit 28 (FIG. 1) of ABS 20. Thereafter, process control loops back to block 234 to continue to detect magnetic fields and continuously check the signal processing chain for operability. This process can be repeated continuously each time that vehicle 22 is energized. Thus, continuous fault detection for functional safety during the lifetime of wheel speed sensor system 32 is possible during both of the operational mode (e.g., vehicle 22 in motion) and the standstill mode (vehicle 22 energized but currently not in motion) and faults can be signaled within an output protocol generated by the protocol generator or by switching the circuit into a diagnostic safe state.

The methodology implementing coil structure 38 can enable detection of a well-defined switching excitation field, e.g., reference magnetic field 54. Magnetic field conversion and sensor sensitivity can be measured because internal magnetic field 54 has a defined value and timing, dependent only on the current flowing through coil structure 38. Accordingly, reference magnetic field 54 may be used as reference for calibration and for continuously monitoring the sensor sensitivity over external conditions (e.g., supply voltage or temperature over lifetime).

The amplitude in least significant bits (LSB) of the data word representative of reference magnetic field 54 may be measured behind bandpass filter 156 (FIG. 6). With this amplitude measurement, a determination can be made as to whether a bias magnet associated with first and second magnetic sense elements 40, 42 is still attached or may have lost its magnetization. Further, the performance of the analog-to-digital conversion together with decimation and linearization can be checked by comparing the measured amplitude as compared with an expected signal amplitude. Thus, sensor sensitivity may be calculated and correction factors may be applied. Still further, supply voltage and temperature dependency may be calculated and calibrated in-situ, correction factors may be applied, and a very fast recovery of the zero crossing after ABS standstill may be possible.

The methodology implementing coil structure 38 can further enable the measurement of noise level at the output of the decimation filter. The measured noise may be compared with a theoretical expected noise level generated by the internal signal processing of ASIC 74 (e.g., due to thermal noise). If the measured noise level exceeds the expected guard band an error flag may be risen. This excessive noise level may indicate an external disturbing magnetic field or a broken component within the ASIC signal processing chain.

The methodology implementing coil structure 38 can further enable comparison of the ASIC-internally generated magnetic excitation field (i.e., internal magnetic field 54) with a theoretically expected signal through a digital level and timing check within a controllable tolerance range on signal amplitude and frequency. If the tolerance range is exceeded, an error flag can be set or the device may switch into the diagnostic safe state.

Consequently, the result produced in response to reference magnetic field 54 may be used in subsequent fault signal processing in order to indicate device failures or parameter shifts (for example, wrong field conversion or incorrect sensitivity due to missing or partly destroyed bias magnet), high noise level, incorrect analog-to-digital conversion and filtering, and/or wrong zero-crossing detection. These faults may be indicated by an error protocol during ABS standstill or by a diagnostic safe state of the ASIC within the specified fault tolerance time.

The above embodiment pertains to a magnetic field sensor system that includes one or more magnetic sense elements and methodology for testing the operability of the magnetic field sensor system. However, this principle may be applied to other sensor systems as well. For example, a sensor system may include a sense element (e.g., acceleration sense element, angular velocity sense element, pressure sense element, etc.) that is configured to detect an external signal (e.g., acceleration force, angular velocity, pressure, etc.). The sensor system may additionally include a source structure proximate the sense element that is configured to provide a reference signal that is detectable by the sense element. The sense element is thus configured to produce a composite signal having a reference signal portion and a measurement signal portion, where the reference signal portion is indicative of the reference signal and the measurement signal portion is indicative of the external signal. The reference signal can be continuously provided while the system is in an operational mode. A processing circuit, such as that described above, may be coupled with the sense element, where the processing circuit is configured to process the composite signal to produce a measurement output signal indicative of the external signal. A qualification circuit, such as that described above, may be coupled with the processing circuit at multiple test points, where the qualification circuit is configured to detect the reference signal portion at the multiple test points and determine an operability of at least a portion of the system from the reference signal portion detectable at each of the multiple test points.

Embodiments described herein entail magnetic field sensor systems and methodology for continuously testing the operability of such magnetic field sensor systems during functional operation. An embodiment of a system comprises a magnetic field sense element configured to detect an external magnetic field and a magnetic field source proximate the magnetic field sense element and configured to provide a reference magnetic field that is detectable by the magnetic sense element, wherein the magnetic field sense element is configured to produce a composite signal having a reference signal portion and a measurement signal portion, the reference signal portion being indicative of the reference magnetic field and the measurement signal portion being indicative of the external magnetic field. The system further comprises a power supply coupled with the magnetic field source and configured to provide a supply current through the magnetic field source for continuously generating the reference magnetic field while the system is in an operational mode.

In a system capable of functioning in-situ in either of an operational mode and a standby mode, the system including a magnetic sense element, an embodiment of a method comprises continuously energizing a magnetic field source proximate the magnetic sense element when the system is in both of the operational mode and the standby mode, the magnetic field source providing a reference magnetic field that is detectable by the magnetic sense element, detecting an external magnetic field and the reference magnetic field at the magnetic sense element, and producing a composite signal having a reference signal portion and a measurement signal portion, the reference signal portion being indicative of the reference magnetic field and the measurement signal portion being indicative of the external magnetic field. The method further comprises processing the composite signal, at a processing circuit, to produce a measurement output signal indicative of the external magnetic field, detecting the reference signal portion at a qualification circuit coupled with the processing circuit at multiple test points, and determining, at the qualification circuit, an operability of at least a portion of the system from the reference signal portion detectable at each of the multiple test points.

An embodiment of a speed sensor system comprises a magnetic field sense element configured to detect an external magnetic field, wherein the speed sensor system selectively functions in-situ in either of an operational mode and a standby mode, the external magnetic field is available for detection by the magnetic sense element in the operational mode, and the external magnetic field is not available for detection by the magnetic sense element in the standby mode. The speed sensor system further comprises a magnetic field source proximate the magnetic field sense element and configured to provide a reference magnetic field that is detectable by the magnetic sense element, wherein the magnetic field sense element is configured to produce a composite signal having a reference signal portion and a measurement signal portion, the reference signal portion being indicative of the reference magnetic field and the measurement signal portion being indicative of the external magnetic field. The speed sensor system further comprises a power supply coupled with the magnetic field source and configured to provide a supply current through the magnetic field source for continuously generating the reference magnetic field while the speed sensor system is in the operational and standstill modes, a processing circuit coupled with the magnetic sense element, the processing circuit being configured to process the composite signal to produce a measurement output signal indicative of the external magnetic field, and a qualification circuit coupled with the processing circuit at multiple test points, the qualification circuit being configured to detect the reference signal portion at the multiple test points and determine an operability of at least a portion of the system from the reference signal portion detectable at each of the multiple test points.

The magnetic field sensor system may be implemented as a wheel speed sensor system of an anti-lock braking system (ABS) application in which the wheel speed sensor system typically functions in either of an operational mode or a standby (e.g., a standstill) mode. In the operational mode, a magnetic sense element of the wheel speed sensor detects an external magnetic field indicative of the speed of an object, such as a vehicle. In the standstill mode, the vehicle is energized but is not currently moving. Therefore, the external magnetic field (e.g., a change in the external magnetic field) is not available for detection by the magnetic sense element. A magnetic field source, in proximity to the magnetic sense element of the speed sensor, continuously provides a reference magnetic field when the system is in both of the operational and standstill modes. The reference magnetic field, with defined amplitude and frequency, can be detected by the magnetic sense element to determine in-situ operability of the speed sensor system. That is, the entire signal path can be monitored during the functional operation of the magnetic field sensor system to identify device failures during operation and/or to detect sensitivity changes or drifts, excessive noise levels, and the like.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A system comprising:
a magnetic field sense element configured to detect an external magnetic field;
a magnetic field source proximate the magnetic field sense element and configured to provide a reference magnetic field that is detectable by the magnetic sense element, wherein the magnetic field sense element is configured to produce a composite signal having a reference signal portion and a measurement signal portion, the reference signal portion being indicative of the reference magnetic field and the measurement signal portion being indicative of the external magnetic field;
a power supply coupled with the magnetic field source and configured to provide a supply current through the magnetic field source for continuously generating the reference magnetic field while the system is in an operational mode;
a processing circuit coupled with the magnetic sense element, the processing circuit being configured to process the composite signal to produce a measurement output signal indicative of the external magnetic field, wherein processing circuit comprises an analog-to-digital converter (ADC) system configured to convert the composite signal to a digitized composite signal; and
a qualification circuit coupled with the processing circuit at multiple test points, the qualification circuit being configured to detect the reference signal portion at the multiple test points and determine an operability of at least a portion of the system from the reference signal portion detectable at each of the multiple test points, wherein the multiple test points include a first test point, the first test point including a first interconnect between the ADC system and the qualification circuit, wherein the qualification circuit is configured to detect a digitized qualification reference signal portion of the reference signal portion in the digitized composite signal and produce a first error flag when the digitized qualification reference signal portion is outside of a first expected signal range.

2. The system of claim 1 wherein the processing circuit comprises a first filter element configured to remove the reference signal portion from the composite signal to produce the measurement output signal from the measurement signal portion of the composite signal.

3. The system of claim 1 wherein the qualification circuit comprises a second filter element configured to remove the measurement signal portion from the composite signal to produce the reference signal portion prior to determining the operability of the at least a portion of the system.

4. The system of claim 1 wherein the ADC system comprises:
a sigma-delta ADC configured to receive the composite signal and convert the composite signal to a digitized intermediate composite signal; and
a decimation structure configured to receive the digitized intermediate composite signal and process the digitized intermediate composite signal to produce the digitized composite signal, wherein a condition in which the digitized qualification reference signal portion is outside of the first expected signal range indicates one of a sigma-delta ADC fault and a decimation structure fault.

5. The system of claim 1 wherein the processing circuit further comprises:
a linearization circuit configured to produce a linearized composite signal in response to the digitized composite signal; and
the multiple test points a second test point, the second test point including a second interconnect between the linearization circuit and the qualification circuit, wherein the qualification circuit is further configured to detect a linearized qualification reference signal portion of the reference signal portion in the linearized composite signal and produce a second error flag when the linearized qualification reference signal portion is outside of a second expected signal range.

6. The system of claim 5 wherein the linearization circuit further comprises a stray field compensation section configured to compensate for a stray field signal portion superimposed on the composite signal, the stray field signal portion being indicative of a stray magnetic field in the presence of the external magnetic field, wherein a condition in which the linearized qualification reference signal portion is outside of the second expected signal range indicates at least one of a linearization circuit fault and insufficient suppression of the stray field signal portion at the stray field compensation section.

7. The system of claim 1 wherein the processing circuit further comprises:
a signal conditioning circuit configured to compensate for a variable signal portion within the digitized composite signal to produce a compensated composite signal; and
a comparator element having inputs coupled with the signal conditioning circuit, the comparator element being configured to produce a third error flag when the compensated composite signal is outside of a third expected signal range.

8. The system of claim 1 wherein the system selectively functions in-situ in either of the operational mode and a standby mode, wherein the external magnetic field is available for detection by the magnetic sense element in the operational mode, the external magnetic field is not available for detection by the magnetic sense element in the standby mode, and the power supply is configured to provide the supply current when the system is in both of the operational and standby modes.

9. The system of claim 8 the processing circuit is further configured to produce the measurement output signal indicative of the external magnetic field when the system is in the operational mode, and the processing circuit is further configured to process the reference signal portion of the composite signal to produce a reference output signal indicative of the reference magnetic field when the system is in the standby mode.

10. A system comprising:
a magnetic field sense element configured to detect an external magnetic field, wherein the system selectively functions in-situ in either of the operational mode and a standby mode, the external magnetic field is available for detection by the magnetic sense element in the operational mode, and the external magnetic field is not available for detection by the magnetic sense element in the standby mode;
a magnetic field source proximate the magnetic field sense element and configured to provide a reference magnetic field that is detectable by the magnetic sense element, wherein the magnetic field sense element is configured to produce a composite signal having a reference signal portion and a measurement signal portion, the reference signal portion being indicative of the reference magnetic field and the measurement signal portion being indicative of the external magnetic field;
a power supply coupled with the magnetic field source and configured to provide a supply current through the magnetic field source for continuously generating the reference magnetic field while the system is in the operational and standby modes; and
a processing circuit coupled with the magnetic sense element, the processing circuit being configured to process the measurement signal portion of the composite signal to produce a measurement output signal indicative of the external magnetic field when the system is in the operational mode, and the processing circuit being further configured to process the reference signal portion of the composite signal to produce a reference output signal indicative of the reference magnetic field when the system is in the standby mode, wherein the magnetic sense element, the magnetic field source, the power supply, and the processing circuit are implemented within a speed sensor system, and the standby mode is a standstill mode of the speed sensor system in which the speed sensor system detects that an object is immobile in response to an absence of the external magnetic field.

11. In a system capable of functioning in-situ in either of an operational mode and a standby mode, the system including a magnetic sense element, a method comprising:
continuously energizing a magnetic field source proximate the magnetic sense element when the system is in both of the operational mode and the standby mode, the magnetic field source providing a reference magnetic field that is detectable by the magnetic sense element;
detecting an external magnetic field and the reference magnetic field at the magnetic sense element;
producing a composite signal having a reference signal portion and a measurement signal portion, the reference signal portion being indicative of the reference magnetic field and the measurement signal portion being indicative of the external magnetic field;
processing the composite signal, at a processing circuit, to produce a measurement output signal indicative of the external magnetic field;
converting the composite signal to a digitized composite signal;
detecting a qualification reference signal portion at a qualification circuit coupled with the processing circuit at multiple test points by filtering the digitized composite signal at the qualification circuit to detect a digitized qualification reference signal portion of the reference signal portion in the digitized composite signal; and
determining, at the qualification circuit, an operability of at least a portion of the system from the digitized qualification reference signal portion detectable at each of the multiple test points; and
producing a first error flag when the digitized qualification reference signal portion is outside of a first expected signal range, the first error flag being indicative of a first fault condition of the system.

12. The method of claim 11 wherein when the digitized qualification reference signal portion inside of the first expected signal range, the method further comprises:
processing the digitized composite signal to produce a linearized composite signal;
filtering the linearized composite signal at the qualification circuit to detect a linearized qualification reference signal portion of the reference signal portion in the linearized composite signal; and
producing a second error flag when the linearized qualification reference signal portion is outside of a second expected signal range, the second error flag being indicative of a second fault condition of the system.

13. The method of claim 12 wherein when the linearized qualification reference signal portion is inside of the second expected signal range, the method further comprises:
filtering the linearized composite signal to remove the reference signal portion from the linearized composite signal to produce a linearized measurement signal portion, and
processing the linearized measurement signal portion to produce the measurement output signal indicative of the external magnetic field.

14. The method of claim 13 further comprising:
determining that the measurement output signal indicates an absence of the external magnetic field;
obtaining the reference signal portion from the linearized composite signal;
processing the reference signal portion to produce a reference output signal indicative of the reference magnetic field; and
identifying an absence of the reference output signal, wherein the absence of the reference output signal is indicative of a third fault condition of the system.

15. A speed sensor system comprising:
magnetic field sense elements configured to detect an external magnetic field, wherein the speed sensor system selectively functions in-situ in either of an operational mode and a standby mode, the external magnetic field is available for detection by the magnetic sense elements in the operational mode, and the external magnetic field is not available for detection by the magnetic sense element in the standby mode;
a magnetic field source proximate the magnetic field sense elements and configured to provide a reference magnetic field that is detectable by the magnetic sense elements, wherein the magnetic field sense elements are configured to produce a composite signal having a reference signal portion and a measurement signal portion, the reference signal portion being indicative of the reference magnetic field and the measurement signal portion being indicative of the external magnetic field;

a power supply coupled with the magnetic field source and configured to provide a supply current through the magnetic field source for continuously generating the reference magnetic field while the speed sensor system is in the operational and standby modes;

a processing circuit coupled with the magnetic sense elements, the processing circuit being configured to process the composite signal to produce a measurement output signal indicative of the external magnetic field, wherein the processing circuit comprises an analog-to-digital converter (ADC) system configured to receive the composite signal and convert the composite signal to a digitized composite signal; and a qualification circuit coupled with the processing circuit at multiple test points, the qualification circuit being configured to detect the reference signal portion at the multiple test points and determine an operability of at least a portion of the system from the reference signal portion detectable at each of the multiple test points, wherein the multiple test points include a first test point, the first test point including a first interconnect between the ADC system and the qualification circuit, wherein the qualification circuit is configured to detect a digitized qualification reference signal portion of the reference signal portion in the digitized composite signal and produce a first error flag when the digitized qualification reference signal portion is outside of a first expected signal range.

16. The speed sensor system of claim 15 wherein the processing circuit further comprises:

a linearization circuit configured to produce a linearized composite signal in response to the digitized composite signal; and the multiple test points include a second test point, the second test point including a second interconnect between the linearization circuit and the qualification circuit, wherein the qualification circuit is further configured to detect a linearized qualification reference signal portion of the reference signal portion in the linearized composite signal and produce a second error flag when the linearized qualification reference signal portion is outside of a second expected signal range.

* * * * *